US012751015B2

(12) United States Patent
Noh et al.

(10) Patent No.: US 12,751,015 B2
(45) Date of Patent: Sep. 29, 2026

(54) SEMICONDUCTOR DEVICE AND METHOD FOR MANUFACTURING THE SAME, AND ELECTRONIC SYSTEM INCLUDING SEMICONDUCTOR DEVICE

(71) Applicant: SAMSUNG ELECTRONICS CO., LTD., Suwon-si (KR)

(72) Inventors: Suseong Noh, Suwon-si (KR); Sangwoo Han, Suwon-si (KR); Kwang-Soo Kim, Suwon-si (KR); Ilho Myeong, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 289 days.

(21) Appl. No.: 18/588,712

(22) Filed: Feb. 27, 2024

(65) Prior Publication Data

US 2025/0048643 A1 Feb. 6, 2025

(30) Foreign Application Priority Data

Aug. 3, 2023 (KR) ........................ 10-2023-0101840

(51) Int. Cl.

*H10B 51/20* (2023.01)
*H10B 51/30* (2023.01)
*H10B 51/40* (2023.01)

(52) U.S. Cl.

CPC ............. *H10B 51/20* (2023.02); *H10B 51/30* (2023.02); *H10B 51/40* (2023.02)

(58) Field of Classification Search

None
See application file for complete search history.

(56) References Cited

U.S. PATENT DOCUMENTS

| | | | | |
|---|---|---|---|---|
| 11,127,759 | B2 | 9/2021 | Obu et al. | |
| 11,302,714 | B2 | 4/2022 | Cui et al. | |
| 11,315,946 | B2 | 4/2022 | Lee et al. | |
| 11,488,977 | B2 | 11/2022 | Wu et al. | |
| 11,756,596 | B1 * | 9/2023 | Luo .......................... | G11C 7/18 365/244 |

(Continued)

FOREIGN PATENT DOCUMENTS

| | | | |
|---|---|---|---|
| KR | 10-0754264 | 9/2007 | |
| KR | 20240016371 A * | 2/2024 | ........... H10D 30/694 |

*Primary Examiner* — Michael Lebentritt
(74) *Attorney, Agent, or Firm* — Fish & Richardson P.C.

(57) ABSTRACT

The present disclosure relates to a semiconductor device and a data storage system including the device. The semiconductor device has a substrate including a cell array region and a contact region. In the cell array region the semiconductor device has a first horizontal conductive layer, a gate stacking structure including a plurality of interlayer insulating layers and a plurality of gate electrodes alternately stacked on the substrate. A channel structure extends in a direction crossing into the substrate by penetrating the gate stacking structure in the cell array region, and includes a channel layer connected to the substrate. Surrounding the channel layer is a ferroelectric layer. The first horizontal conductive layer is not in direct contact with the channel layer due to a dummy pattern positioned on the first horizontal conductive layer and disposed between the substrate and the ferroelectric layer.

20 Claims, 25 Drawing Sheets

(56) References Cited

U.S. PATENT DOCUMENTS

| | | | | |
|---|---|---|---|---|
| 2012/0099387 | A1* | 4/2012 | Shim | G11C 16/26 365/189.05 |
| 2021/0305276 | A1 | 9/2021 | Kim et al. | |
| 2022/0173117 | A1 | 6/2022 | Choi | |
| 2022/0285302 | A1 | 9/2022 | Choi et al. | |
| 2022/0392919 | A1* | 12/2022 | Wang | H10B 51/10 |
| 2023/0247832 | A1* | 8/2023 | Choi | H10B 43/27 257/314 |
| 2023/0337438 | A1* | 10/2023 | Park | H10B 51/30 |
| 2025/0081442 | A1* | 3/2025 | Kim | H10B 12/482 |
| 2025/0133742 | A1* | 4/2025 | Noh | H10B 51/10 |
| 2025/0142834 | A1* | 5/2025 | Noh | H10B 51/20 |

* cited by examiner

SEMICONDUCTOR DEVICE AND METHOD FOR MANUFACTURING THE SAME, AND ELECTRONIC SYSTEM INCLUDING SEMICONDUCTOR DEVICE

CROSS-REFERENCE TO RELATED APPLICATION

This application claims priority to and the benefit of Korean Patent Application No. 10-2023-0101840 filed in the Korean Intellectual Property Office on Aug. 3, 2023, the entire contents of which are incorporated herein by reference.

BACKGROUND

Semiconductor memory devices may be largely classified into volatile memory devices and non-volatile memory devices. The volatile memory device is a memory device in which a stored data disappears when a power supply is stopped, and includes, for example, a dynamic random access memory (DRAM) and a static random access memory (SRAM). In addition, the non-volatile memory device is a memory device in which a stored data is not destroyed even if the supply of the power is interrupted, for example, includes a programmable ROM (PROM), an erasable PROM (EPROM), an electrically EPROM (EEPROM), a flash memory device, etc. Also, recently, in line with a trend of high performance and low power consumption of the semiconductor memory devices, the next generation semiconductor memory devices having non-volatile properties such as a magnetic random access memory (MRAM), a phase-change random access memory (PRAM), and a ferroelectric random access memory (FeRAM) are being developed. As higher integration and higher performance of the semiconductor devices are required, various studies using the semiconductor devices with different characteristics are being conducted.

Accordingly there is a great need for improvements in the fabrication and design of such semiconductor devices used for memory.

SUMMARY

The implementations described herein are to provide a semiconductor device with improved reliability and a data storage system including these semiconductor devices.

A semiconductor device includes a substrate including a cell array region and a contact region and having a first horizontal conductive layer, a gate stacking structure including a plurality of interlayer insulating layers and a plurality of gate electrodes alternately stacked on the substrate, a channel structure extending in a direction crossing the substrate by penetrating the gate stacking structure in the cell array region, and a channel layer connected to the substrate and a ferroelectric layer surrounding the channel layer, and a dummy pattern positioned on the first horizontal conductive layer and disposed between the substrate and the ferroelectric layer.

An electron system including a semiconductor device includes a main substrate, a semiconductor device on the main substrate, and a controller electrically connected to the semiconductor device on the main substrate, wherein the semiconductor device includes a peripheral circuit region, a cell region including an input/output connection wire electrically connected to the peripheral circuit region, and an input/output pad electrically connected to the input/output connection wire extending in the cell region, the cell region includes a substrate including a first horizontal conductive layer, a gate stacking structure including a plurality of interlayer insulating layers and a plurality of gate electrodes alternately stacked on the substrate, a channel structure extending passing through the gate stacking structure in a direction that intersects the substrate In the cell array region, and including a channel layer connected to the substrate, and a ferroelectric layer surrounding the channel layer, and a dummy pattern positioned on the first horizontal conductive layer and disposed between the substrate and the ferroelectric layer.

A manufacturing method of a semiconductor device includes stacking a horizontal insulation layer and a third horizontal conductive layer on a second horizontal conductive layer, forming a dummy hole by patterning the third horizontal conductive layer so that the upper surface of the horizontal insulation layer is exposed, forming a dummy pattern within the dummy hole, forming a stacking structure by sequentially repeating an interlayer insulating layer and a sacrificial insulation layer on the third horizontal conductive layer and the dummy pattern, forming a channel structure penetrating the stacking structure, the dummy pattern, and the horizontal insulation layer, removing the horizontal insulation layer and forming a first horizontal conductive layer within the removed space, and removing the sacrificial insulation layer and forming a gate electrode within the removed space.

The reliability of the semiconductor devices may be improved.

DETAILED DESCRIPTION

Figure 1:
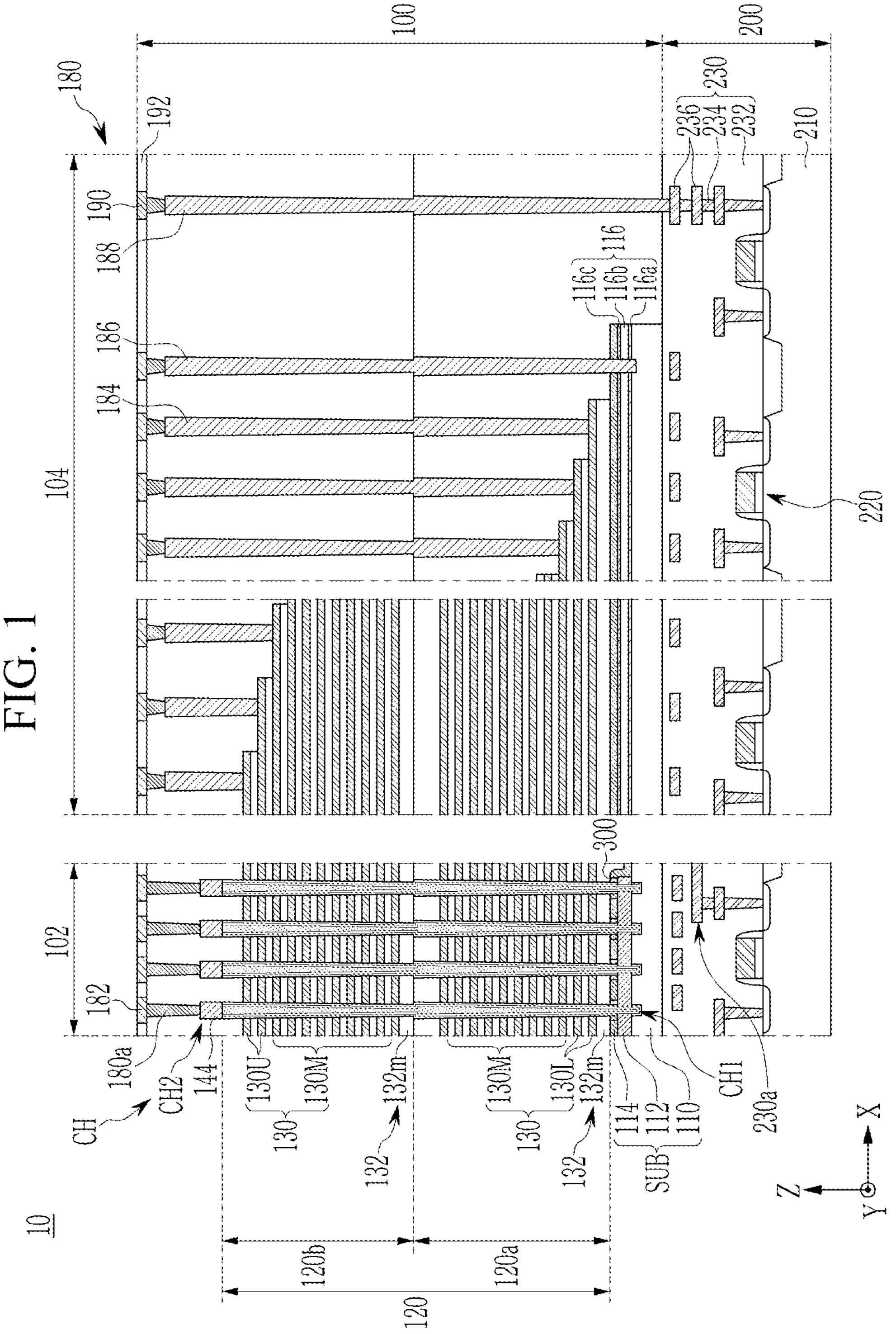
FIG. 1 and FIG. 2 are cross-sectional views showing an example semiconductor device.

The present invention will be described more fully hereinafter with reference to the accompanying drawings, in which implementations of the invention are shown. As those skilled in the art would realize, the described implementations may be modified in various different ways, all without departing from the spirit or scope of the present invention.

In order to clarify the present invention, parts that are not connected with the description will be omitted, and the same elements or equivalents are referred to by the same reference numerals throughout the specification.

Further, since sizes and thicknesses of constituent members shown in the accompanying drawings are arbitrarily given for better understanding and ease of description, the present invention is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, in the specification, the phrase "on a plane" means when an object portion is viewed from above, and the phrase "on a cross-section" means when a cross-section taken by vertically cutting an object portion is viewed from the side.

Hereinafter, a semiconductor device is described with reference to FIG. 1 to FIG. 6 as follows.

Figure 2:
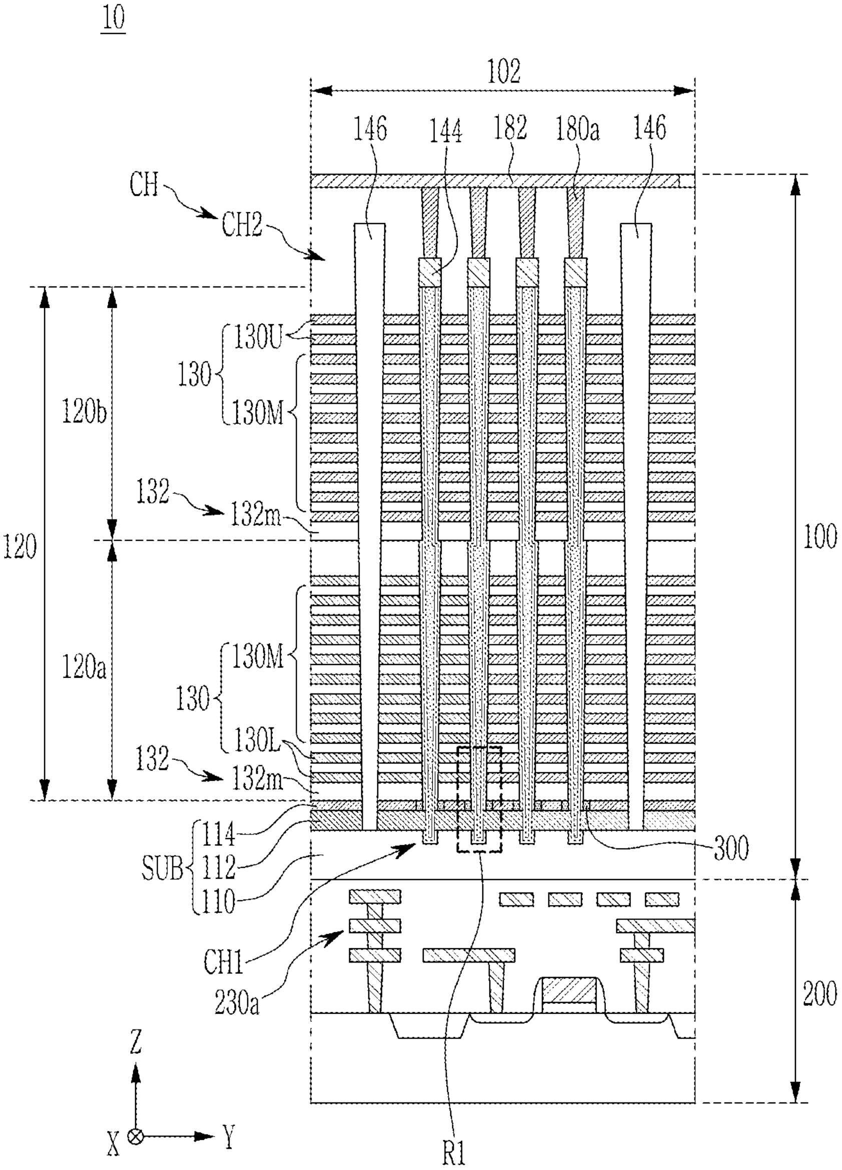
Figure 3:
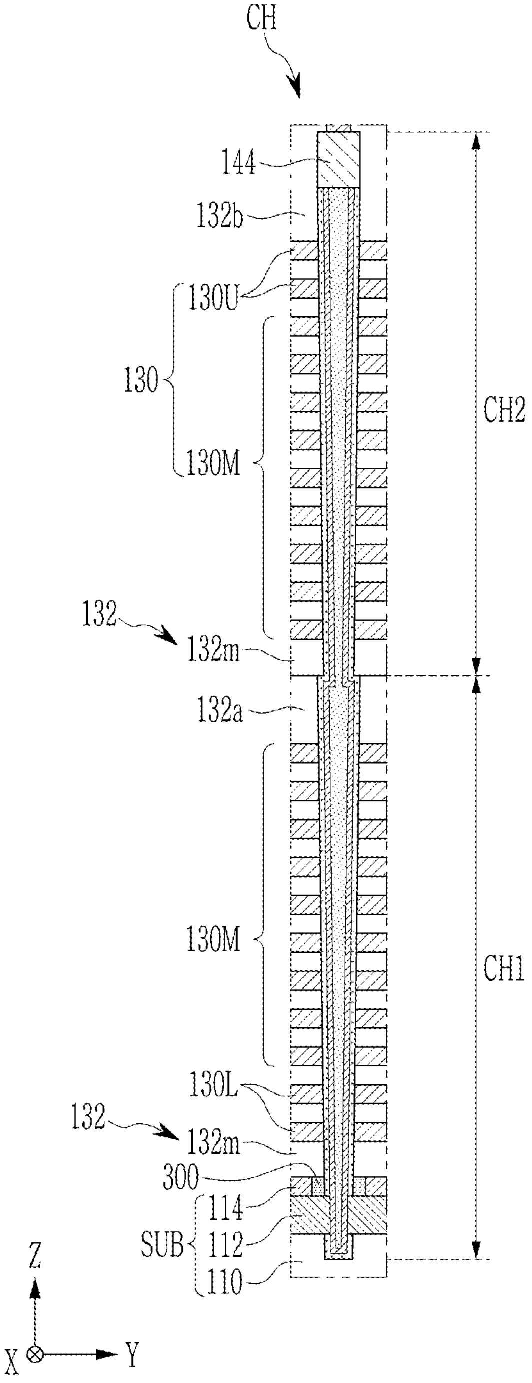
FIG. 3 and FIG. 4 are cross-sectional views showing various examples of a channel structure included in a semiconductor device shown in FIG. 1.
Figure 4:
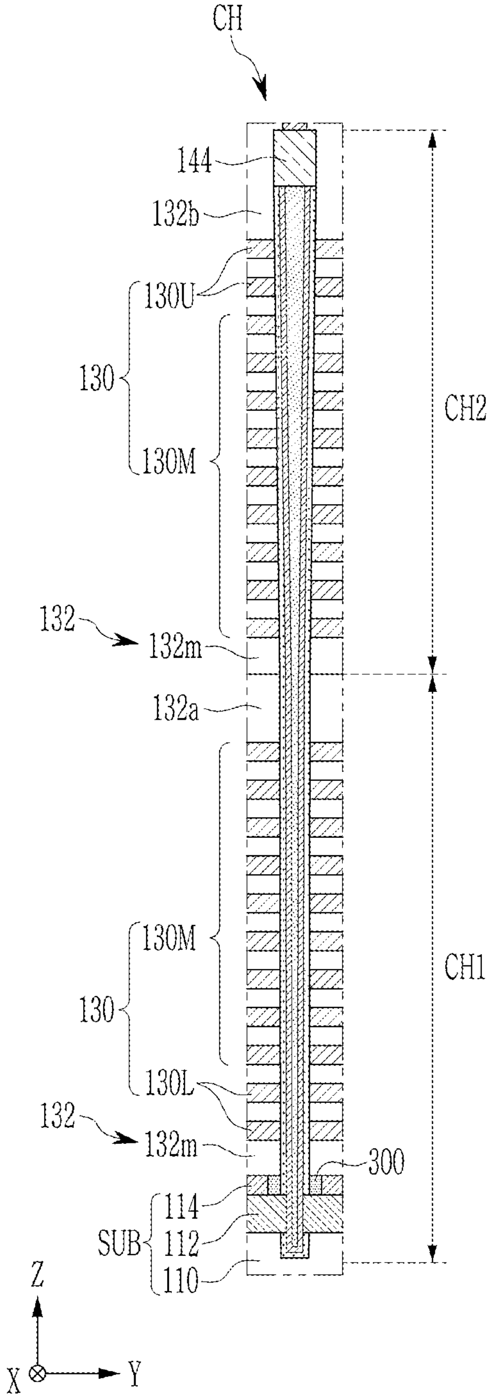
Figure 5:
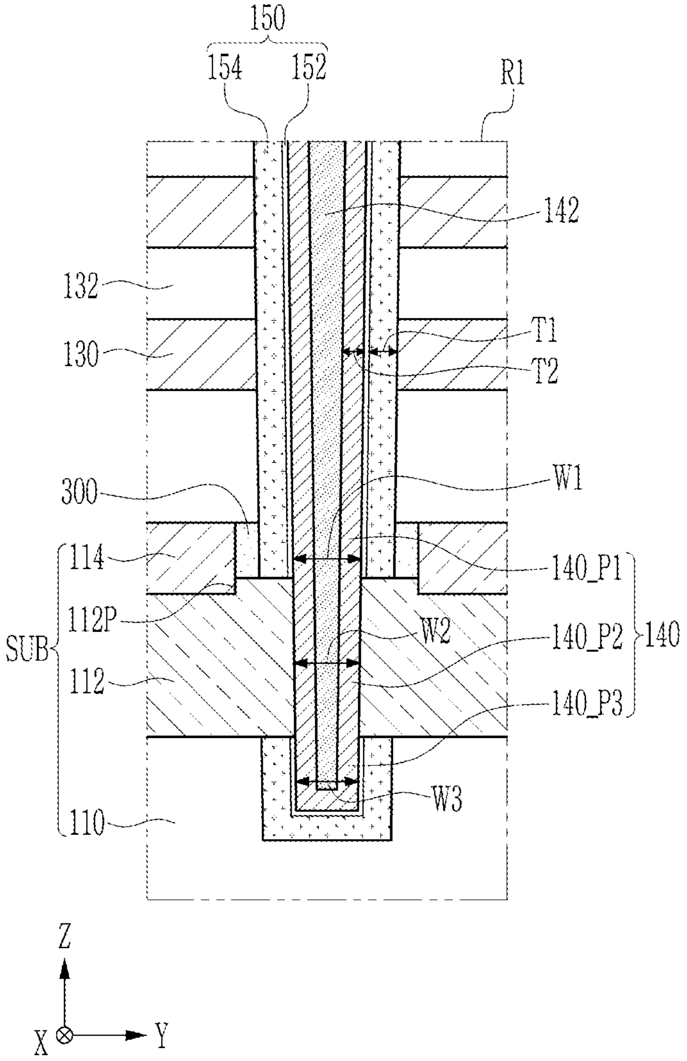
FIG. 5 is an enlarged cross-sectional view of a region R1 of FIG. 2.

FIG. 1 and FIG. 2 are cross-sectional views showing a semiconductor device. FIG. 3 and FIG. 4 are cross-sectional views showing various examples of a channel structure included in a semiconductor device shown in FIG. 1. FIG. 5 is an enlarged cross-sectional view of a region R1 of FIG. 2. FIG. 6 to FIG. 10 are cross-sectional views showing various implementations of a semiconductor device corresponding to a region R1 of FIG. 2.

First, referring to FIG. 1 to FIG. 5, a semiconductor device 10 may include a cell region 100 in which a memory cell structure is provided, and a circuit region 200 in which a peripheral circuit structure for controlling the operation of the memory cell structure is provided. For example, the circuit region 200 and the cell region 100 are shown in FIG. 1 may be a part corresponding to the first structure 1100F and the second structure 1100S of the semiconductor device 1100 included in the electron system 1000 shown in FIG. 22. Alternatively, the circuit region 200 and the cell region 100 may be a part corresponding to the first structure 3100 and the second structure 3200 of the semiconductor chip 2200 shown in 24, respectively.

Here, the circuit region 200 may include a peripheral circuit structure positioned on the first substrate 210, and the cell region 100 may include a gate stacking structure 120 and a channel structure CH positioned on the cell array region 102 of the second substrate SUB as a memory cell structure. A first wire part 230 electrically connected to the peripheral circuit structure may be positioned in the circuit region 200, and a second wire part 180 electrically connected to the memory cell structure may be positioned in the cell region 100.

In an implementation, the cell region 100 may be positioned over the circuit region 200. Accordingly, since it is not necessary to secure the area corresponding to the circuit region 200 separately from the cell region 100, the area of the semiconductor device 10 may be reduced. However, the implementation is not limited thereto, and the circuit region 200 may be positioned next to the cell region 100. Various other changes are possible.

The circuit region 200 may include a first substrate 210, and a circuit element 220 and a first wire part 230 positioned on the first substrate 210.

The first substrate 210 may be a semiconductor substrate including a semiconductor material. For example, the first substrate 210 may be a semiconductor substrate made of a semiconductor material or may be a semiconductor substrate on which a semiconductor layer is formed on a base substrate. For example, the first substrate 210 may be made of silicon, epitaxial silicon, germanium, silicon-germanium, silicon-on-insulator (SOI), or germanium-on-insulator (GOI).

The circuit element 220 disposed on the first substrate 210 may include various circuit elements that control the operation of the memory cell structure provided in the cell region 100. For example, the circuit element 220 may constitute a peripheral circuit structure such as a decoder circuit (a reference numeral 1110 in FIG. 22), a page buffer (a reference numeral 1120 in FIG. 22), and a logic circuit (a reference numeral 1130 in FIG. 22).

The circuit element 220 may include, for example, a transistor, but is not limited thereto. For example, the peripheral circuit element 220 may include not only active elements such as transistors, but also passive elements such as capacitors, resistors, and inductors.

The first wire part 230 positioned on the first substrate 210 may be electrically connected to the circuit element 220. In an implementation, the first wire part 230 may include a plurality of wiring layers 236 spaced apart with a first insulation layer 232 therebetween and connected by contact vias 234 to form a desired path. The wiring layer 236 or the contact vias 234 may include various conductive materials, and the first insulation layer 232 may include various insulating materials.

The cell region 100 of the semiconductor device 10 may include a second substrate SUB, a dummy pattern 300, a gate stacking structure 120, a channel structure CH, a separation structure 146, and a gate contact part 184.

The second substrate SUB may include a cell array region 102 and a contact region 104. The gate stacking structure 120 and the channel structure CH may be positioned above the second substrate SUB in the cell array region 102. The gate contact part 184 for connecting the gate stacking structure 120 on the second substrate SUB in the contact region 104, the gate stacking structure 120 of the cell array region 102 to the circuit region 200 or the external circuit, and/or a structure for connecting the channel structure CH to the circuit region 200 or the external circuit may be positioned.

At least a part of the first insulation layer 232 may be positioned between the second substrate SUB and the first wire part 230. The part of the first insulation layer 232 positioned between the second substrate SUB and the first wire part 230 may be made of a single layer or multiple layers. For example, a layer including silicon nitride and a layer including silicon oxide may be positioned between the second substrate SUB and the first wire part 230. At this time, a layer containing silicon oxide may be positioned on a layer containing silicon nitride.

In the cell array region 102, the gate stacking structure 120 including cell insulation layers 132 and gate electrodes 130 alternately stacked on the first surface (e.g., a front surface or an upper surface) of the second substrate SUB, and the channel structure CH extending in a direction (e.g., a third direction (a Z direction)) crossing the second substrate SUB through the gate stacking structure 120 may be disposed.

The second substrate SUB of the semiconductor device 10 may include a second horizontal conductive layer 110, a first horizontal conductive layer 112, and a third horizontal conductive layer 114, which are sequentially accumulated.

The second horizontal conductive layer 110 may perform a function of a common source line. The second horizontal conductive layer 110 may function as a source region that supplies a current to memory cells positioned on the second substrate SUB. The second horizontal conductive layer 110 may be made in a plate shape. That is, the second horizontal conductive layer 110 may be made of a plate common source line.

The second horizontal conductive layer 110 may include a semiconductor material (e.g., polysilicon). For example, the second horizontal conductive layer 110 may include impurity doped polysilicon. However, it is not limited thereto, and for example, the second horizontal conductive layer 110 may include a metallic material or a metal silicide.

In the cell array region 102, the first horizontal conductive layer 112 may be positioned on the second horizontal conductive layer 110.

The first horizontal conductive layer 112 may electrically connect the channel structure CH and the second horizontal conductive layer 110. For example, the first horizontal conductive layer 112 may connect the channel layer 140 and the second horizontal conductive layer 110 of the channel structure CH. The first horizontal conductive layer 112 may function as a part of a common source line (e.g., referring to CSL of FIG. 22) of the semiconductor device 10. For example, the first horizontal conductive layer 112 and the second horizontal conductive layer 110 may function as a common source line.

The first horizontal conductive layer 112 may be penetrated by the channel structure CH. For example, as shown in the enlarged view of FIG. 3 to FIG. 5, the channel structure CH may extend through the first horizontal conductive layer 112 to reach the second horizontal conductive layer 110. At this time, the ferroelectric layer 154 and the channel insulation layer 152 of the channel structure CH are removed at the position where the first horizontal conductive layer 112 is positioned, so that the first horizontal conductive layer 112 may be connected to the channel layer 140. That is, the first horizontal conductive layer 112 may directly contact the channel layer 140. Accordingly, the first horizontal conductive layer 112 may electrically connect the second horizontal conductive layer 110 and the channel layer 140.

As shown in FIG. 5, the first horizontal conductive layer 112 may include a protruding portion 112P protruded toward a third direction (a Z direction). For example, the first horizontal conductive layer 112 may be protruded toward the dummy pattern 300. The protruding portion 112P may be protruded in the third direction (the Z direction) between the third horizontal conductive layers 114. Accordingly, the first horizontal conductive layer 112 may cover a portion of the side surface of the third horizontal conductive layer 114.

In some regions of the contact region 104, the first horizontal conductive layer 112 may not be provided between the second horizontal conductive layer 110 and the gate stacking structure 120. In this case, the horizontal insulation layer 116 may be provided between the second horizontal conductive layer 110 and the gate stacking structure 120. For example, in some regions of the contact region 104, first to third horizontal insulation layers 116*a*, 116*b*, and 116*c* may be sequentially positioned on the second horizontal conductive layer 110. The first to third horizontal insulation layers 116*a*, 116*b*, and 116*c* may include various insulating materials. For example, the second 110 and third horizontal conductive layers 114 may include silicon oxide, and the first horizontal conductive layer 112 may include silicon nitride. The first to third horizontal insulation layers 116*a*, 116*b*, and 116*c* may be materials remaining in some regions of the contact region 104 in a replacement process for forming the first horizontal conductive layer 112.

The third horizontal conductive layer 114 may be positioned on the first horizontal conductive layer 112 and the horizontal insulation layer 116. The third horizontal conductive layer 114 may extend along a first direction (a X direction) and a second direction (a Y direction) in the cell array region 102 and the contact region 104.

The third horizontal conductive layer 114 may electrically connect the channel structure CH and the second horizontal conductive layer 110 together with the first horizontal conductive layer 112. The third horizontal conductive layer 114 may function as a part of the common source line of the semiconductor device 10. For example, the third horizontal conductive layer 114 may function as a common source line together with the first horizontal conductive layer 112 and/or the second horizontal conductive layer 110. The third horizontal conductive layer 114 may be penetrated by the channel structure CH. The dummy pattern 300 may be positioned between the third horizontal conductive layer 114 and the channel structure CH.

The third horizontal conductive layer 114 may be used as a support layer to prevent a collapse or falling of the mold stack in a replacement process for forming the first horizontal conductive layer 112.

The first horizontal conductive layer 112 and the third horizontal conductive layer 114 may include a semiconductor material (e.g., polysilicon). For example, the first horizontal conductive layer 112 may include impurity doped polysilicon, and the third horizontal conductive layer 114 may include impurity doped polysilicon or may be a layer including impurity diffused from the first horizontal conductive layer 112. However, implementations are not limited thereto, and the third horizontal conductive layer 114 may include an insulating material. Alternatively, the third horizontal conductive layer 114 may not be provided separately.

In an implementation, when the third horizontal conductive layer 114 includes a semiconductor material, the third horizontal conductive layer 114 may have a low etch rate with respect to an etching solution for etching the stacking structure (120*d* of FIG. 15) and/or the horizontal insulation layer 116. Therefore, as a comparative example of the semiconductor device 10, in a case of forming a channel hole CT penetrating the stacking structure (120*d* of FIG. 15) and the third horizontal conductive layer 114, a process defect in which the third horizontal conductive layer 114 may remain in the portion penetrating the third horizontal conductive layer 114 of the channel hole (CT of FIG. 15).

Further referring to FIG. 5, at least part of the dummy pattern 300 may be surrounded by the second substrate SUB.

Specifically, the dummy pattern 300 may be positioned on the first horizontal conductive layer 112. For example, the dummy pattern 300 may be positioned on the protruding portion 112P of the first horizontal conductive layer 112. The dummy pattern 300 may overlap the third horizontal conductive layer 114 in the first direction (the X direction) and the second direction (the Y direction). That is, the dummy pattern 300 may cover a part of the side surface of the third horizontal conductive layer 114. The dummy pattern 300 may directly contact the third horizontal conductive layer 114. However, it is not limited thereto, and the dummy pattern 300 may be positioned apart from the third horizontal conductive layer 114 in the first direction (the X direction) or in the second direction (the Y direction). In this case, a channel insulation layer may be further provided between the dummy pattern 300 and the third horizontal conductive layer 114.

The dummy pattern 300 may surround at least part of the channel structure CH. For example, the dummy pattern 300 may be positioned between the third horizontal conductive layer 114 and the channel structure CH. The dummy pattern 300 may be positioned between the third horizontal conductive layer 114 and the ferroelectric layer 154 of the channel structure CH.

The dummy pattern 300 may directly contact the ferroelectric layer 154. However, the implementation is not limited thereto, and a dielectric layer may be further positioned between the dummy pattern 300 and the ferroelectric layer 154. In this case, the dummy pattern 300 may be positioned apart from the ferroelectric layer 154 in the first direction (the X direction) or the second direction (the Y direction). The description of this may be described with reference to FIG. 8 to FIG. 10.

The dummy pattern 300 may include various insulating materials. The dummy pattern 300 may include a material having an etch rate similar to that of the stacking structure (120*d* of FIG. 15) and/or the horizontal insulation layer 116. For example, the dummy pattern 300 may have a similar etch rate with respect to an etching solution for etching the stacking structure (120*d* in FIG. 15). The dummy pattern 300 may include, for example, at least one of silicon oxide, silicon nitride, silicon oxynitride, silicon carbon oxide, silicon carbonate nitride, silicon carbide nitride, and aluminum oxide.

In an implementation, the dummy pattern 300 may be a structure for forming the channel structure CH straightly in one direction in the region overlapping the third horizontal conductive layer 114. Specifically, in the process of forming the channel structure CH of the semiconductor device 10, a channel hole (CT in FIG. 15) passing through the gate stacking structure 120 and the dummy pattern 300 may be formed. At this time, since the dummy pattern 300 has a similar etch rate to the etching solution that etches the stacking structure (120*d* in FIG. 15), the sidewall of the channel hole (CT in FIG. 15) may extend straightly along one direction. That is, the channel hole (CT in FIG. 15) may not be folded or bent in a portion overlapping the dummy pattern 300 in the second direction (the Y direction).

The gate stacking structure 120 in which the cell insulation layers 132 and the gate electrodes 130 are alternately stacked may be positioned on the second substrate SUB (e.g., on the third horizontal conductive layer 114 of the second substrate SUB).

In an implementation, the gate stacking structure 120 may include a plurality of gate stacking structures 120*a* and 120*b* sequentially stacked on the second substrate SUB. Then, since the number of stacked gate electrodes 130 may be increased, the number of the memory cells may be increased in a stable structure. For example, the gate stacking structure 120 may include the first and second gate stacking structures 120*a* and 120*b*, thereby increasing a data storage capacity and simplifying the structure. However, the implementation is not limited thereto, and the gate stacking structure 120 may be composed of one gate stacking structure or may include three or more gate stacking structures.

In the gate stacking structure 120, the gate electrode 130 may include a lower gate electrode 130L, a memory cell gate electrode 130M, and an upper gate electrode 130U sequentially positioned from the second substrate SUB. The lower gate electrode 130L may be used as a gate electrode of a ground selection transistor, the memory cell gate electrode 130M may constitute a memory cell, and the upper gate electrode 130U may be used as a gate electrode of a string selection transistor. The number of memory cell gate electrodes 130M may be determined according to the data storage capacity of the semiconductor device 10. In an example, one, two, or more lower gate electrodes 130L and upper gate electrodes 130U may be provided, and may have the same structure as the memory cell gate electrode 130M or a different structure therefrom. Also, a part of the gate electrode 130, for example, the memory cell gate electrode 130M adjacent to the lower gate electrode 130L and the upper gate electrode 130U may be a dummy gate electrode.

The cell insulation layer 132 may include an interlayer insulating layer 132*m* positioned under the gate electrode 130 or between two adjacent gate electrodes 130 in the first and second gate stacking structures 120*a* and 120*b*, and upper insulation layers 132*a* and 132*b* positioned on the first and second gate stacking structures 120*a* and 120*b*. For example, the upper insulation layer 132*a* and 132*b* may include a first upper insulation layer 132*a* positioned on the first gate stacking structure 120*a* and a second upper insulation layer 132*b* positioned on the second gate stacking structure 120*b*. At this time, the first upper insulation layer 132*a* is an intermediate insulation layer positioned between the first gate stacking structure 120*a* and the second gate stacking structure 120*b*, and the second upper insulation layer 132*b* is an uppermost insulation layer. positioned on top of the gate stacking structure 120. The second upper insulation layer 132*b* may form a part or all of the cell region insulation layer positioned entirely over the cell region 100. In the implementation, the thicknesses of the plurality of cell insulation layers 132 may not all be the same. For example, the thicknesses of the upper insulation layers 132*a* and 132*b* may be greater than the thickness of the interlayer insulating layer 132*m*. However, the shape and structure of the cell insulation layer 132 may be variously changed.

In the drawings, in the contact region 104, it is shown as an example that the cell insulation layer 132 has a boundary between the first gate stacking structure 120*a* and the second gate stacking structure 120*b*. But, an implementation is not limited thereto. In the contact region 104, a plurality of insulation layers may have various stacking structures, and the implementation is not limited thereto.

The gate electrode 130 may include various conductive materials. For example, the gate electrode 130 may include a metallic material such as tungsten (W), copper (Cu), or aluminum (Al). As another example, the gate electrode 130 may include polysilicon, metal nitride (e.g., titanium nitride (TiN), tantalum nitride (TaN), etc.), or a combination thereof. Although not shown, outside the gate electrode 130, an insulation layer made of an insulating material may be positioned or a portion of the gate dielectric layer 150 may be positioned. The cell insulation layer 132 may include various insulating materials. For example, the cell insulation layer 132 may include silicon oxide, silicon nitride, silicon oxynitride, or a low dielectric constant material having a smaller dielectric constant than silicon oxide, or a combination thereof.

In an implementation, the channel structure CH may pass through the gate stacking structure 120 and extend in a direction (e.g., the third direction (the Z direction)) crossing the second substrate SUB.

In further detail, the channel structure CH may include a channel layer 140, and a gate dielectric layer 150 positioned on the channel layer 140 between the gate electrode 130 and the channel layer 140. The channel structure CH may further include a core insulation layer 142 positioned inside the channel layer 140, and may further include a channel pad 144 disposed on the channel layer 140 and/or the gate dielectric layer 150.

Each channel structure CH form one memory cell string, and a plurality of channel structures CH may be spaced apart from each other while forming rows and columns on a plane. For example, a plurality of channel structures CH may be disposed in various forms such as a lattice form and a zigzag form on a plane. The channel structure CH may have a column shape. For example, when viewing in cross-section, the channel structure CH may have an inclined side surface such that the width becomes narrower as it approaches the second substrate SUB according to an aspect ratio. However, the implementation is not limited thereto, and the arrangement, structure, and shape of the channel structure CH may be variously changed.

The channel structure CH may penetrate at least a part of the second substrate SUB. For example, the channel structure CH may pass through the dummy pattern 300 and the first horizontal conductive layer 112 and be buried in the second horizontal conductive layer 110. The channel structure CH may be in direct contact with the second substrate SUB. For example, the channel structure CH may be in direct contact with the first horizontal conductive layer 112 and the second horizontal conductive layer 110. In an implementation, the width of the channel structure CH along the second direction (the Y direction) may be smaller than the width of the dummy pattern 300 along the second direction (the Y direction). Here, the width of the channel structure CH according to the second direction (the Y direction) may be the maximum width of the channel structure CH according to the second direction (the Y direction). Accordingly, the channel structure CH may be disposed to pass through the dummy pattern 300.

Figure 6:
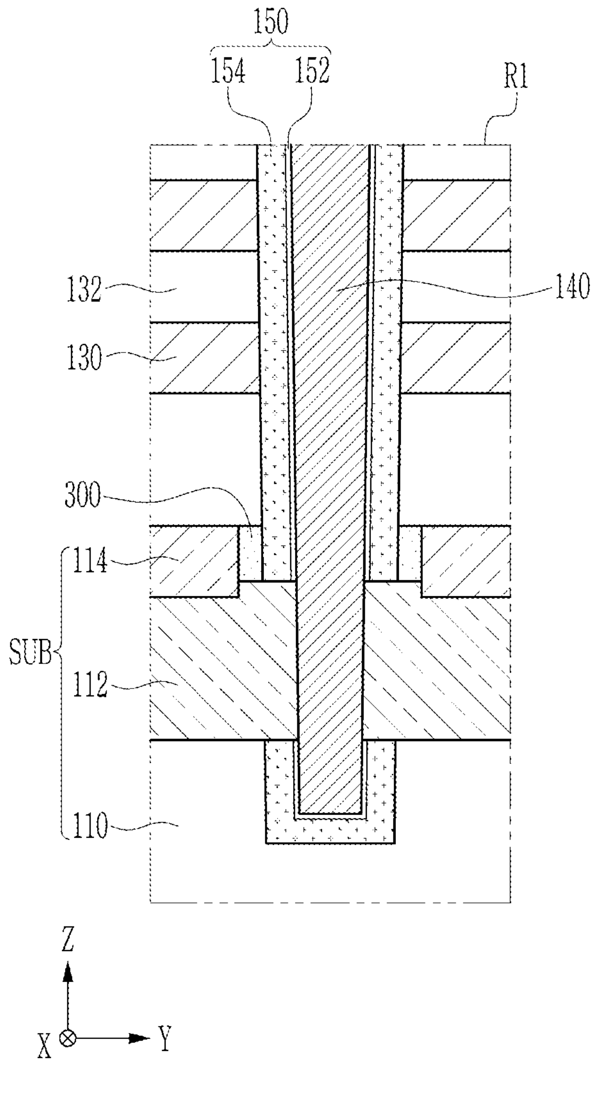
FIG. 6 to FIG. 10 are cross-sectional views showing alternative implementations of a semiconductor device corresponding to a region R1 of FIG. 2.

The core insulation layer 142 may be provided in the central region of the channel structure CH, and the channel layer 140 may be disposed while covering the sidewall of the core insulation layer 142. For example, the core insulation layer 142 may have a column shape (e.g., a cylinder shape or a polygonal column shape), and the channel layer 140 may have a planar shape such as an annular shape. However, an implementation is not limited to this, as shown in FIG. 6, the core insulation layer 142 may not be provided and the channel layer 140 may have a column shape (e.g., a cylinder shape or a polygonal column shape).

The channel layer 140 may penetrate at least part of the second substrate SUB. For example, the channel layer 140 may pass through the third horizontal conductive layer 114 and the first horizontal conductive layer 112 and be buried in the second horizontal conductive layer 110. The channel layer 140 may be electrically connected to the second substrate SUB. The channel layer 140 may directly contact at least a portion of the second substrate SUB. For example, a part of the side surface of the channel layer 140 may be electrically connected by directly contacting the side surface of the first horizontal conductive layer 112.

The channel layer 140 may extend straightly in one direction within the second substrate SUB. In further detail, the portion of the channel layer 140 overlapping the second substrate SUB in the first direction (the X direction) and the second direction (the Y direction) may extend while forming a predetermined angle with the bottom surface of the second substrate SUB. That is, the channel layer 140 may have an inclined side surface such that the width narrows as it approaches the second substrate SUB. For example, the portion of the channel layer 140 overlapping the dummy pattern 300 in the second direction (the Y direction) and the portion of the channel layer 140 overlapping the first horizontal conductive layer 112 in the second direction (the Y direction) may extend straightly in one direction. For example, the portion of the channel layer 140 overlapping the dummy pattern 300 in the second direction (the Y direction) and the portion of the channel layer 140 overlapping the first horizontal conductive layer 112 in the second direction (the Y direction) may be extended while forming an angle of 85 degrees to 90 degrees with the bottom surface of the second substrate SUB.

The portion of the channel layer 140 overlapping the dummy pattern 300 in the second direction (the Y direction) is referred to as a first portion 140_P1, the portion of the channel layer 140 overlapping the first horizontal conductive layer 112 in the second direction (the Y direction) is referred to as a second portion 140_P2, and the portion of the channel layer 140 overlapping the second horizontal conductive layer 110 in the second direction (the Y direction) is referred to as a third portion 140_P3. In an implementation, the second portion 140_P2 of the channel layer 140 may be positioned on the first portion 140_P1, and the third portion 140_P3 may be positioned on the second portion 140_P2. The side surfaces of the first portion 140_P1 to the third portion 140_P3 may extend straightly in one direction.

In an implementation, the first width W1 according to the second direction (the Y direction) of the first portion 140_P1 may be greater than or equal to the second width W2 according to the second direction (the Y direction) of the second portion 140_P2. In addition, the second width W2 according to the second direction (the Y direction) of the second portion 140_P2 may be greater than or equal to the third width W3 according to the second direction (the Y direction) of the third portion 140_P3. That is, the first width W1 according to the second direction (the Y direction) of the first portion 140_P1 may be greater than or equal to the third width W3 according to the second direction (the Y direction) of the third portion 140_P3. Here, the first width W1 to the third width W3 may be a distance extending in the second direction (the Y direction) between one side and the other side of the exterior side of the channel layer 140.

The channel layer 140 may include a semiconductor material, for example, polysilicon. The core insulation layer 142 may include various insulating materials. For example, the core insulation layer 142 may include silicon oxide, silicon nitride, silicon oxynitride, or a combination thereof. However, the materials of the channel layer 140 and the core insulation layer 142 are not limited thereto.

The gate dielectric layer 150 positioned between the gate electrode 130 and the channel layer 140 may include a channel insulation layer 152 and a ferroelectric layer 154 sequentially stacked on the channel layer 140.

The channel insulation layer 152 may surround the channel layer 140. The channel insulation layer 152 may be positioned over the first horizontal conductive layer 112. One end of the channel insulation layer 152 may be positioned between the dummy patterns 300. That is, the channel insulation layer 152 may overlap the dummy pattern 300 in the third direction (the Z direction). The bottom surface of the channel insulation layer 152 may be aligned on the same boundary as the bottom surface of the dummy pattern 300. The channel insulation layer 152 may include an insulating material. For example, the channel insulation layer 152 may include a material such as silicon oxide, silicon nitride, or silicon oxynitride. For example, the channel insulation layer 152 may be formed by stacking a layer including silicon oxide and a layer including silicon nitride.

The ferroelectric layer 154 may surround the channel insulation layer 152. The ferroelectric layer 154 may extend along the sidewall of the channel hole (CT in FIG. 15) to have a conformal shape. The ferroelectric layer 154 may be formed to cover the inner sidewall and bottom surface of the channel hole (CT in FIG. 15). The ferroelectric layer 154 may be positioned between the plurality of gate electrodes 130 and the channel insulation layer 152 and between the plurality of interlayer insulating layers 132*m* and the channel insulation layer 152. The ferroelectric layer 154 may be interposed between the channel insulation layer 152 and the gate electrode 130.

The ferroelectric layer 154 may be positioned over the first horizontal conductive layer 112. One end of the ferroelectric layer 154 may be positioned between the dummy patterns 300. For example, the ferroelectric layer 154 may be positioned between the dummy pattern 300 and the channel insulation layer 152. That is, the ferroelectric layer 154 may overlap the dummy pattern 300 in the third direction (the Z direction). In an implementation, by positioning the ferroelectric layer 154 between the dummy pattern 300 and the channel insulation layer 152, the ferroelectric layer 154 may be in non-contact with the third horizontal conductive layer 114. The bottom surface of the ferroelectric layer 154 may be aligned on the same boundary as the bottom surface of the channel insulation layer 152 and the bottom surface of the dummy pattern 300.

In an implementation, the first thickness T1 along the second direction (the Y direction) of the ferroelectric layer 154 may be greater than the second thickness T2 along the second direction (the Y direction) of the channel layer 140. For example, the first thickness T1 according to the second direction (the Y direction) of the ferroelectric layer 154 may be 100 nm to 200 nm, but is not limited thereto.

The ferroelectric layer 154 may include a ferroelectric material. For example, the ferroelectric layer 154 may include an Hf compound having a ferroelectric characteristic. For example, the ferroelectric layer 154 may include $HfO_2$, HfZnO, HfSiO, HfSiON, HfTaO, HITIO, HfZrO or a combination thereof. In addition, the ferroelectric layer 154 may include, for example, a ferroelectricity material of a perovskite structure such as PZT(PbZrxTil-xO3), $BaTiO_3$, $PbTiO_3$. The ferroelectric layer 154 may include at least one dopant selected from carbon (C), silicon (Si), magnesium (Mg), aluminum (Al), yttrium (Y), nitrogen (N), germanium (Ge), tin (Sn), strontium (Sr), lead (Pb)), calcium (Ca), barium (Ba), titanium (Ti), zirconium (Zr), gadolinium (Gd), and lanthanum (La). The ferroelectric layer 154 may be made of a crystalline material. For example, the ferroelectric layer 154 may have a crystal structure of an orthorhombic system.

In an implementation, when the ferroelectric layer 154 includes ferroelectrics, the ferroelectric layer 154 may be configured to have polarizations of various states according to a voltage applied between the gate electrode 130 and the channel layer 140. Specifically, for the ferroelectric layer 154, a residual polarization may be generated in the ferroelectric layer 154 by a voltage applied between the gate electrode 130 and the channel structure CH. Here, the magnitude of the remnant polarization generated in the ferroelectric layer 154 may be determined not only by the magnitude of the voltage applied between the gate electrode 130 and the channel layer 140, but also by a PV (polarization-voltage) hysteresis characteristic which takes into account a process which generated the residual polarization in the ferroelectric layer 154. The generated remnant polarization may be stored in the ferroelectric layer 154, and a signal information may be stored in a nonvolatile manner by the stored remnant polarization. That is, the ferroelectric layer 154 may function as a non-volatile memory layer.

Meanwhile, the degree of the residual polarization generated and/or stored by the ferroelectric layer 154 may be determined by the thickness of the ferroelectric layer 154 and the distance between the ferroelectric layer 154 and the channel layer 140. Therefore, in order for the ferroelectric layer 154 to function as a non-volatile memory layer, the ferroelectric layer 154 needs to have a predetermined thickness. Here, the thickness of the ferroelectric layer 154 may be the thickness in the first direction (the X direction) or the second direction (the Y direction). In this case, as the thickness of the ferroelectric layer 154 increases, there may be insufficient space for forming the channel layer 140.

The ferroelectric layer 154 and the channel layer 140 of the semiconductor device 10 may extend straightly in one direction within the second substrate SUB. This is because the channel hole (CT in FIG. 15) extends straightly in one direction, and the ferroelectric layer 154 and the channel layer 140 are formed to have a conformal shape in the channel hole (CT in FIG. 15).

Accordingly, even when the ferroelectric layer 154 of the semiconductor device 10 is formed with a predetermined thickness, since the channel structure CH is formed penetrating the dummy pattern 300, the sufficient space for forming the channel layer 140 may be provided in the portion where the channel structure CH overlaps the dummy pattern 300 in the second direction (the Y direction). This is because the portion of the channel layer 140 overlapping the dummy pattern 300 in the second direction (the Y direction) is straightly extended without being folded or bent.

The channel pad 144 may be positioned on the channel layer 140 and/or the gate dielectric layer 150. The channel pad 144 may cover the upper surface of the core insulation layer 142 and be disposed to be electrically connected to the channel layer 140. Although the channel pad 144 is shown covering the upper surface of the gate dielectric layer 150 in the figures, implementations are not limited thereto. For example, the channel pad 144 may not cover the upper surface of the gate dielectric layer 150. In this case, the side surfaces of the channel pad 144 may be surrounded by the gate dielectric layer 150. The side surface of the channel pad 144 may be in contact with the channel insulation layer 152. The channel pad 144 may include a conductive material, for example, impurity doped polysilicon. However, the material of the channel pad 144 is not limited thereto and may be variously changed.

As described above, if the gate stacking structure 120 includes the plurality of gate stacking structures 120*a* and 120*b* stacked on each other, the channel structure CH may include the plurality of channel structures CH1 and CH2 passing through the plurality of gate stacking structures 120*a* and 120*b*, respectively. For example, when the plurality of gate stacking structure 120 includes the first gate stacking structure 120*a* and the second gate stacking structure 120*b*, the plurality of channel structures CH may include the first channel structure CH1 extending through the first gate stacking structure 120*a* and the second channel structure CH2 extending through the second gate stacking structure 120*b*.

The first channel structure CH1 and the second channel structure CH2 may have a form connected to each other. Each of the first channel structure CH1 and the second channel structure CH2 may have an inclined side surface so that the width becomes narrower closer to the second substrate SUB according to the aspect ratio when viewed cross-section. As shown in FIG. 3, a bent portion may be provided due to a difference in the width in the portion where the first channel structure CH1 and the second channel structure CH2 are connected. As another example, as shown in FIG. 4, the first channel structure CH1 and the second channel structure CH2 may have the inclined side surface continuously connected without bending. However, the shapes of the first channel structure CH1 and the second channel structure CH2 are not limited thereto and may be variously changed.

FIG. 1 illustrates that the gate dielectric layer 150, the channel layer 140, and the core insulation layer 142 of the first channel structure CH1 and the second channel structure CH2 have an integral structure formed by extending each other. After forming the first pass-through for the first channel structure CH1 and the second pass-through for the second channel structure CH2, the gate dielectric layer 150, the channel layer 140, and the core insulation layer 142 are formed over the first and second pass-throughs, thereby obtain the above-described structure. But, implementations are not limited thereto. As another example, the gate dielectric layer 150, the channel layer 140, and the core insulation layer 142 of the first channel structure CH1 and the second channel structure CH2 may be formed separately from each other and electrically connected to each other. For example, after forming the first pass-through for the first channel structure CH1, the gate dielectric layer 150, the channel layer 140, and the core insulation layer 142 may be formed on the first pass-through, and after forming the second pass-through for the second channel structure CH2, the gate dielectric layer 150, the channel layer 140, and the core insulation layer 142 may be formed on the second pass-through. Various other changes are possible.

In an implementation, the channel pad 144 may be provided on the channel structure CH (e.g., the second channel structure CH2) provided in the gate stacking structure 120 (e.g., the second gate stacking structure 120*b*) positioned upward among the plurality of gate stacking structures 120. Alternatively, the channel pad 144 may be respectively provided on the first channel structure CH1 and the second channel structure CH2. In this case, the channel pad 144 of the first channel structure CH1 may be connected to the channel layer 140 of the second channel structure CH2.

In an implementation, the gate stacking structure 120 may be partitioned into a plurality of partitions on a plane by a separation structure 146 extending in a direction (e.g., the third direction (the Z direction)) crossing the second substrate SUB and penetrating the gate stacking structure 120.

For example, the separation structure 146 may pass through the gate electrode 130 and the cell insulation layer 132 and extend to the second substrate SUB. On a plane, the separation structure 146 may extend in the first direction (the X direction) and may be provided in a plurality so as to be spaced apart from each other with a predetermined interval in the second direction (the Y direction) intersecting the first direction (the X direction). Accordingly, on a plane, the plurality of gate stacking structures 120 may each be extended in the first direction (the X direction) and spaced apart from each other with a predetermined interval in the second direction (the Y direction). The gate stacking structure 120 partitioned by the separation structure 146 may constitute one memory cell block. However, an implementation is not limited to this, and the range of the memory cell blocks is not limited thereto.

For example, the separation structure 146 may have an inclined side surface of which the width decreases toward the second substrate SUB when being viewed in a cross-section due to a high aspect ratio. However, the implementation is not limited to this, and the side surface of the separation structure 146 may be vertical to the second substrate SUB. In FIG. 2, when being viewed in a cross-section, it is illustrated that the separation structure 146 has the continuously inclined side in the first gate stacking structure 120*a* and the second gate stacking structure 120*b* and does not have a bent portion. However, an implementation is not limited thereto, and the separation structure 146 may include a bent portion at the boundary between the first gate stacking structure 120*a* and the second gate stacking structure 120*b*.

The separation structure 146 may be filled with various insulating materials. For example, the separation structure 146 may include an insulating material such as silicon oxide, silicon nitride, or silicon oxynitride. However, an implementation is not limited thereto, and the structure, shape, material, etc. of the separation structure 146 may be changed in various ways. The semiconductor device may further include an upper separation pattern.

The upper separation pattern may be positioned on the gate stacking structure 120. A plurality of upper separation patterns on a plane may be provided so as to be extended in the first direction (the X direction) and spaced apart from each other with a predetermined interval in the second direction (the Y direction).

The upper separation pattern may be disposed to pass through one or a plurality of gate electrodes 130 including the upper gate electrode 130U positioned between the separation structures 146. The upper separation pattern, for example, may separate the three gate electrodes 130 from each other in the second direction (the Y direction). However, the number of gate electrodes 130 separated by the upper separation pattern is not limited thereto and may be variously changed. The upper separation pattern may have a form filled with an insulating material. For example, the upper separation pattern may include an insulating material such as silicon oxide, silicon nitride, or silicon oxynitride. However, an implementation is not limited thereto, and the structure, shape, material, etc. of the upper separation pattern may be variously changed.

In order to connect the gate stacking structure 120 and the channel structure CH provided in the cell array region 102 to the circuit region 200 or the external circuit, a contact region 104 and a second wire part 180 may be provided.

Here, the second wire part 180 may include all members electrically connecting the gate electrode 130, the channel structure CH, and/or the second substrate SUB to the circuit region 200 or the external circuit. For example, the second wire part 180 may include a bit line 182, a gate contact part 184, a source contact part 186, a through plug 188, a contact via 180*a* each connected to them, and a connection wire 190 connecting them.

The bit line 182 may be positioned on the cell insulation layer 132 of the gate stacking structure 120 disposed in the cell array region 102. The bit line 182 may extend in the second direction (the Y direction). The bit line 182 may be electrically connected to the channel structure CH, for example, the channel pad 144 through the contact via 180*a*, for example, a bit line contact via.

The contact region 104 may be disposed around the cell array region 102. A part of the second wire part 180 may be positioned in the contact region 104. The contact region 104 may include a gate stacking structure 120 positioned on the second substrate SUB and a gate contact part 184 for connecting the gate electrode 130 of the cell array region 102 to the circuit region 200 or an external circuit.

In further detail, the plurality of gate electrodes 130 may be extended and positioned in the second direction (the Y direction) in the contact region 104, and the extension length of the plurality of gate electrodes 130 in the contact region 104 sequentially decreases as the distance from the second substrate SUB increases. For example, the plurality of gate electrodes 130 may be positioned while having a stair shape in the contact region 104. In this case, the plurality of gate electrodes 130 may have a stair shape in one direction or a plurality of directions. In the contact region 104, the plurality of gate contact parts 184 may be electrically connected to the plurality of gate electrodes 130 extending to the contact region 104 through the cell insulation layer 132.

In the contact region 104, the source contact part 186 may penetrate the cell insulation layer 132 and be electrically connected to the second substrate SUB. For example, the source contact part 186 may be electrically connected to the second substrate SUB while passing through the third horizontal conductive layer 114 and the first to third horizontal insulation layers 116*a*, 116*b*, and 116*c*.

The through plug 188 may pass through the gate stacking structure 120 or be disposed outside the gate stacking structure 120 to be electrically connected to the first wire part 230 of the circuit region 200. However, it is not limited thereto, and the through plug 188 may pass through the gate stacking structure 120 and be electrically connected to the first wire part 230 of the circuit region 200.

The connection wire 190 may be positioned in the cell array region 102 and/or the contact region 104. The bit line 182, the gate contact part 184, the source contact part 186 and/or the through plug 188 may be electrically connected to the connection wire 190. For example, the gate contact part 184, the source contact part 186 and/or the through plug 188 may be connected to the connection wire 190 through the contact via 180*a*.

FIG. 1 illustrates that the connection wire 190 is provided as a single layer positioned on the same plane as the bit line 182, and the second insulation layer 192 is positioned on a portion other than the second wire part 180. However, this is only briefly shown for convenience. Therefore, the connection wire 190 may include a plurality of wiring layers for an electrical connection with the bit line 182, the gate contact part 184, the source contact part 186, and/or the through plug 188, and may further include a contact via.

As such, the bit line 182, the gate electrode 130, and/or the second substrate SUB connected to the channel structure CH may be electrically connected to the circuit element 220 of the circuit region 200 by the second wire part 180 and the first wire part 230.

FIG. 1 exemplifies that the gate contact part 184, the source contact part 186, and/or the through plug 188, when viewed cross-section, have an inclined side surface so that the width becomes narrower as it approaches the second substrate SUB according to the aspect ratio, and a bent portion is provided at the boundary between the first gate stacking structure 120*a* and the second gate stacking structures 120*b*. But, an implementation is not limited thereto. For example, it is also possible that the gate contact part 184, the source contact part 186, and/or the through plug 188 do not have a bent portion at the boundary between the first gate stacking structure 120*a* and the second gate stacking structure 120*b*. Various other changes are possible.

The semiconductor device 10 may include a dummy pattern 300 surrounded by the third horizontal conductive layer 114, and the channel structure CH may extend to pass through the dummy pattern 300. Accordingly, the channel structure CH may be extended straightly along one direction. That is, the ferroelectric layer 154 portion and the channel layer 140 portion overlapping the dummy pattern 300 in the second direction (the Y direction) may not be folded or bent.

Also, even when the ferroelectric layer 154 has a predetermined thickness to function as a non-volatile memory layer, sufficient space for forming the channel layer 140 may be provided in a portion where the channel structure CH overlaps the dummy pattern 300 in the second direction (the Y direction). Accordingly, the ferroelectric layer 154 and the channel layer 140 of the semiconductor device 10 may be straightly extended in one direction within the second substrate SUB, and the reliability of the semiconductor device 10 may be improved.

Hereinafter, a semiconductor device will be described with reference to FIG. 7 to FIG. 11. For portions identical to or extremely similar to the portions already described, the detailed descriptions are omitted, and only other portions are described in detail.

Figure 7:
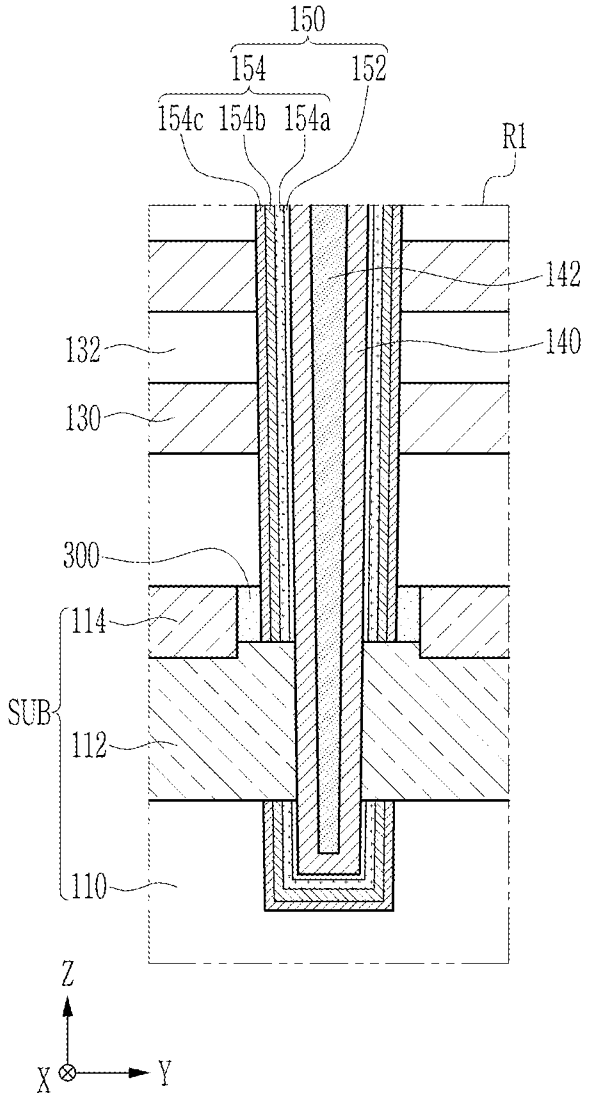

FIG. 7 is a cross-sectional view corresponding to a region R1 of FIG. 2 showing a semiconductor device.

The semiconductor device shown in FIG. 7 is the same as most of the semiconductor device shown in FIG. 1 to FIG. 5 so that the description thereof will be omitted and differences will be mainly described. In addition, the same reference numerals are used for the same constituent elements as the previous implementation. In the present implementation, the ferroelectric layer 154 is made of multiple layers.

Referring to FIG. 7, a channel structure CH of the semiconductor device may include a core insulation layer 142, a channel layer 140, and a gate dielectric layer 150. The gate dielectric layer 150 may include a channel insulation layer 152 and a ferroelectric layer 154.

In some implementations, the ferroelectric layer 154 may consist of multiple layers. For example, the ferroelectric layer 154 may include first to third dielectric material patterns 154*a*, 154*b*, and 154*c*. The first to third dielectric material patterns 154*a*, 154*b*, and 154*c* may sequentially cover the side surface of the channel insulation layer 152.

The first to third dielectric material patterns 154*a*, 154*b*, and 154*c* may sequentially surround the channel insulation layer 152. The first to third dielectric material patterns 154*a*, 154*b*, and 154*c* may extend along the sidewall of the channel hole CT to have a conformal shape. The first to third dielectric material patterns 154*a*, 154*b*, and 154*c* may be disposed to cover the inner sidewall and the bottom surface of the channel hole (CT of FIG. 15). The first to third dielectric material patterns 154*a*, 154*b*, and 154*c* may be sequentially positioned between the plurality of channel insulation layer 152 and the gate electrode 130 and between the plurality of channel insulation layer 152 and the plurality of interlayer insulating layer 132*m*. The first to third dielectric material patterns 154*a*, 154*b*, and 154*c* may be interposed between the channel insulation layer 152 and the gate electrode 130.

At least one of the first to third dielectric material patterns 154$a$, 154$b$, and 154$c$ may include a ferroelectric material. For example, the ferroelectric layer 154 may include an Hf compound having a ferroelectric characteristic. For example, the ferroelectric layer 154 may include $HfO_2$, HfZnO, HfSiO, HfSiON, HfTaO, HfTiO, HfZrO or a combination thereof.

In some implementations, the first to third dielectric material patterns 154$a$, 154$b$, and 154$c$ are shown as being in contact with each other, but it is not limited thereto, an interface insulation layer may be positioned between each of the first to third dielectric material patterns 154$a$, 154$b$, and 154$c$.

FIG. 7 shows a ferroelectric layer 154 which includes three dielectric material layers, but the ferroelectric layer 154 is not limited thereto. For example, the ferroelectric layer 154 may include two or fewer dielectric material layers. Alternatively, the ferroelectric layer 154 may include four or more dielectric material layers.

Figure 8:
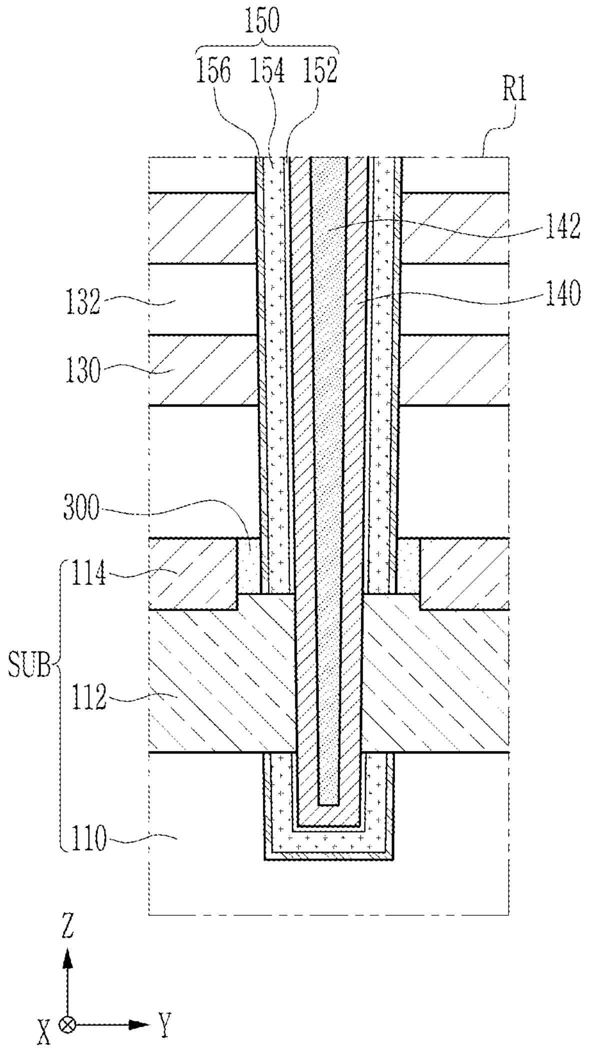

FIG. 8 is a cross-sectional view corresponding to a region R1 of FIG. 2 showing an example semiconductor device.

Figure 9:
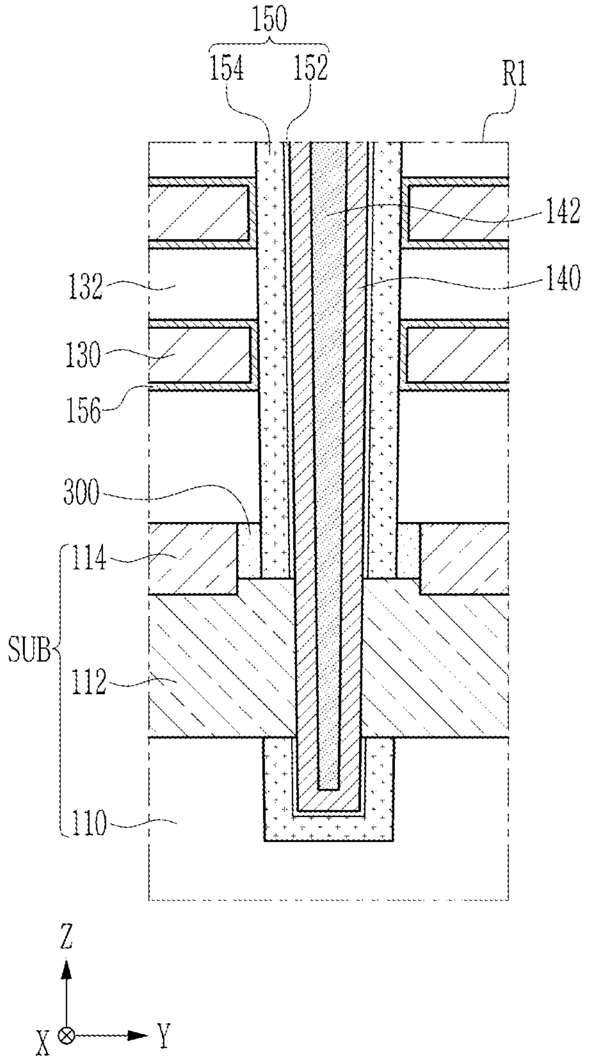
Figure 10:
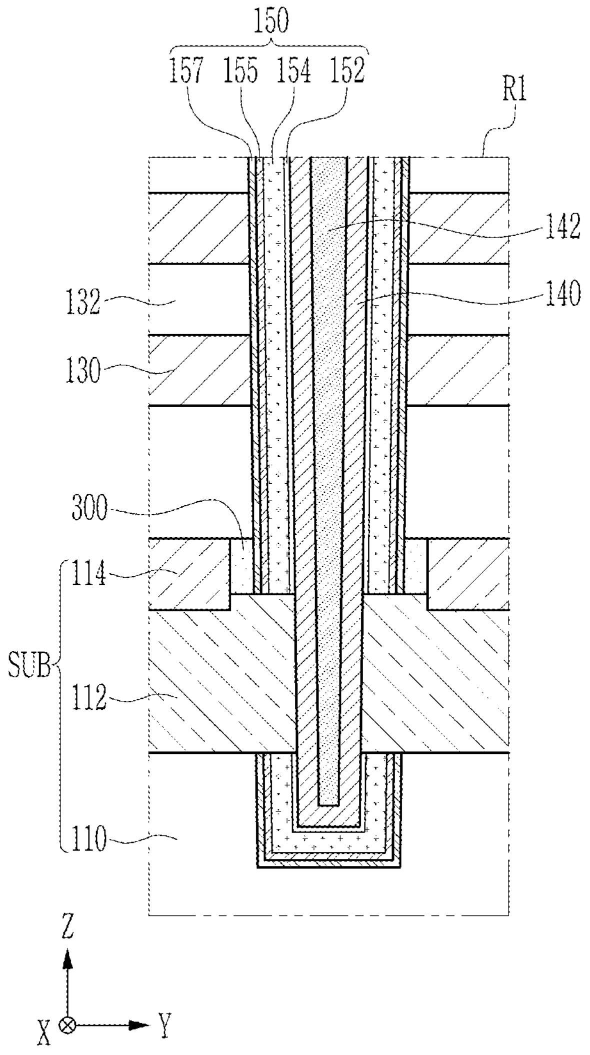

The semiconductor devices shown in FIG. 8 to FIG. 10 are the same as most of the semiconductor device shown in FIG. 1 to FIG. 5 so that the description thereof is omitted and differences are mainly described. In addition, the same reference numerals are used for the same constituent elements as the previous implementation. FIG. 8 illustrates an implementation which is partially different from the previous implementation in that the semiconductor device 10 further includes a charge inflow layer 156, as will be described below.

Referring to FIG. 8, a channel structure CH of a semiconductor device may include a core insulation layer 142, a channel layer 140, and a gate dielectric layer 150. In some implementations, the gate dielectric layer 150 may include a channel insulation layer 152, a ferroelectric layer 154, and a charge inflow layer 156.

The charge inflow layer 156 may surround the ferroelectric layer 154. The charge inflow layer 156 may extend along the sidewall of the channel hole (CT in FIG. 15) to have a conformal shape. The charge inflow layer 156 may be disposed to cover the inner sidewall and the bottom surface of the channel hole (CT in FIG. 15). The charge inflow layer 156 may be positioned between the plurality of gate electrodes 130 and the ferroelectric layer 154 and between the plurality of interlayer insulating layers 132$m$ and the ferroelectric layer 154. The charge inflow layer 156 may be interposed between the ferroelectric layer 154 and the cell insulation layer 132. In the charge inflow layer 156, a charge may be inflowed by a voltage applied to the gate electrode 130. Accordingly, a residual polarization may be generated in the ferroelectric layer 154 by the voltage applied to the plurality of gate electrodes 130 and the charge applied to the charge inflow layer 156.

The charge inflow layer 156 may be positioned on the first horizontal conductive layer 112. One end of the charge inflow layer 156 may be positioned between the dummy patterns 300. For example, the charge inflow layer 156 may be positioned between the dummy pattern 300 and the ferroelectric layer 154. That is, the charge inflow layer 156 may overlap the dummy pattern 300 in the third direction (the Z direction). The bottom surface of the charge inflow layer 156 may be aligned with the same boundary as the bottom surface of the ferroelectric layer 154 and the bottom surface of the dummy pattern 300. By positioning the charge inflow layer 156 between the dummy pattern 300 and the ferroelectric layer 154, the charge inflow layer 156 may not be in contact with the third horizontal conductive layer 114.

FIG. 9 is a cross-sectional view corresponding to a region R1 of FIG. 2 showing a semiconductor device. The shape of the charge inflow layer 156 is partially different from the implementation of FIG. 8.

Referring to FIG. 9, a channel structure CH of a semiconductor device may include a core insulation layer 142, a channel layer 140, and a gate dielectric layer 150. In some implementations, the gate dielectric layer 150 may include a channel insulation layer 152, a ferroelectric layer 154, and a charge inflow layer 156.

The charge inflow layer 156 may surround each of the plurality of gate electrodes 130. The charge inflow layer 156 may extend along the exterior side of each of the plurality of gate electrodes 130 to have a conformal shape. The charge inflow layer 156 may be disposed to cover the exterior side of each of the plurality of gate electrodes 130.

The charge inflow layer 156 may be positioned between the plurality of gate electrodes 130 and the ferroelectric layer 154 and between the plurality of interlayer insulating layers 132$m$ and the plurality of gate electrodes 130 and also between the plurality of gate electrodes 130 and the plurality of cell insulation layers 132. In the charge inflow layer 156, a charge may be inflowed by a voltage applied to the gate electrode 130. Accordingly, a residual polarization may be generated in the ferroelectric layer 154 by the voltage applied to the plurality of gate electrodes 130 and the charge applied to the charge inflow layer 156.

FIG. 10 is a cross-sectional view corresponding to a region R1 of FIG. 2 showing a semiconductor device. In FIG. 10, the semiconductor device 10 is partially different from the previously described implementations in that it further includes a blocking layer 157 and a charge storing layer 155, which will be described below.

Referring to FIG. 10, a channel structure CH of a semiconductor device may include a core insulation layer 142, a channel layer 140, and a gate dielectric layer 150. In some implementations, the gate dielectric layer 150 may include a channel insulation layer 152, a ferroelectric layer 154, a charge storing layer 155, and a blocking layer 157 sequentially stacked on the channel layer 140.

The charge storing layer 155 may surround the ferroelectric layer 154. The charge storing layer 155 may be used as a data storage region. For example, the charge storing layer 155 may include silicon nitride capable of trapping charge. When the charge storing layer 155 is made of silicon nitride, a retention may be excellent and it may be advantageous for an integration, compared to those made of polysilicon. However, the material of the charge storing layer 155 is not limited thereto.

The blocking layer 157 may be disposed between the charge storing layer 155 and the gate electrode 130. The blocking layer 157 may include an insulating material capable of preventing an undesirable charge from inflowing into the gate electrode 130. For example, the blocking layer 157 may include silicon oxide, silicon nitride, silicon oxynitride, a high dielectric constant material or a combination thereof.

Here, the high dielectric constant material means a dielectric material having a higher dielectric constant than silicon oxide. For example, high dielectric constant materials aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide $HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), praseodymium oxide ($Pr_2O_3$) or a combination thereof may be used.

Even in the case of the semiconductor device 10, even when the ferroelectric layer 154 has a predetermined thickness to function as a non-volatile memory layer, a sufficient space for forming the channel layer 140 may be provided in a portion where the channel structure CH overlaps the dummy pattern 300 in the second direction (the Y direction). Accordingly, the ferroelectric layer 154 and the channel layer 140 of the semiconductor device 10 may be straightly extended in one direction within the second substrate SUB, and the reliability of the semiconductor device 10 may be improved.

In addition, since the gate dielectric layer 150 includes the charge storing layer 155 and the blocking layer 157 between the ferroelectric layer 154 and the gate electrode 130, the remnant polarization of the ferroelectric layer 154 may be easily formed according to the voltage applied between the gate electrode 130 and the channel layer 140.

Next, a semiconductor device is described with reference to FIG. 11 which shows a cross-sectional view of the semiconductor device.

Figure 11:
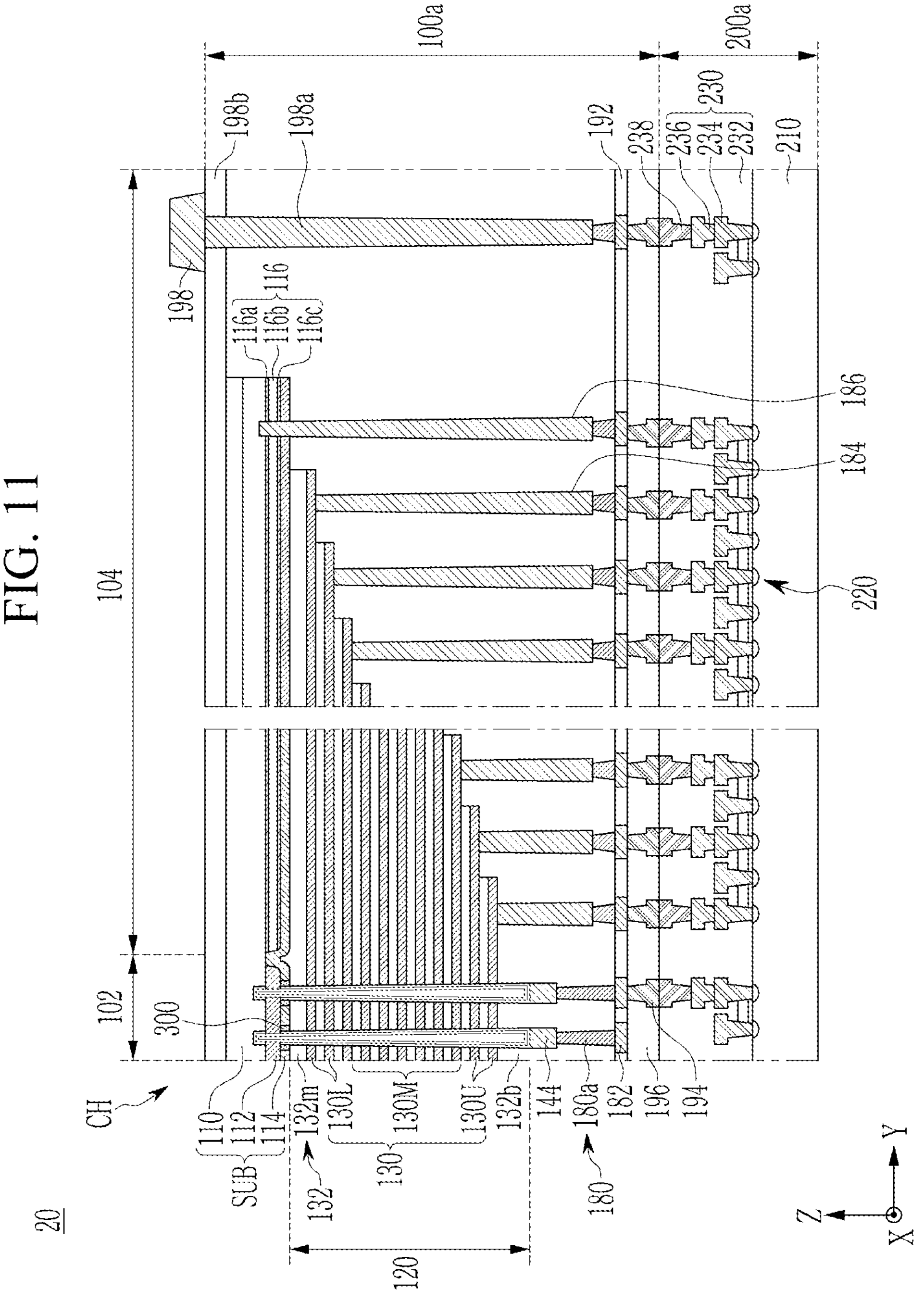
FIG. 11 is a cross-sectional view showing an example semiconductor device.

The implementation shown in FIG. 11 includes the same as most of the implementation shown in FIG. 1 to FIG. 5 so that the description thereof will be omitted and differences will be mainly described. In addition, the same reference numerals are used for the same constituent elements as the previous implementation.

Referring to FIG. 11, a semiconductor device 20 may have a chip to chip (C2C) structure joined with a wafer bonding method. That is, after manufacturing a lower chip including a circuit region 200*a* formed on a first substrate 210 and manufacturing an upper chip including a cell region 100*a* formed on a second substrate SUB, the semiconductor device 20 may be manufactured by joining the upper and lower chips.

The circuit region 200*a* may have a first junction structure 238 on the surface opposite to the cell region 100*a* on a first substrate 210, a circuit element 220, and a first wire part 230.

The cell region 100*a* may include a second junction structure 194 on the surface opposite to the circuit region 200*a* on a second substrate SUB, a gate stacking structure 120, a channel structure CH, and a second wire part 180.

Figure 25:
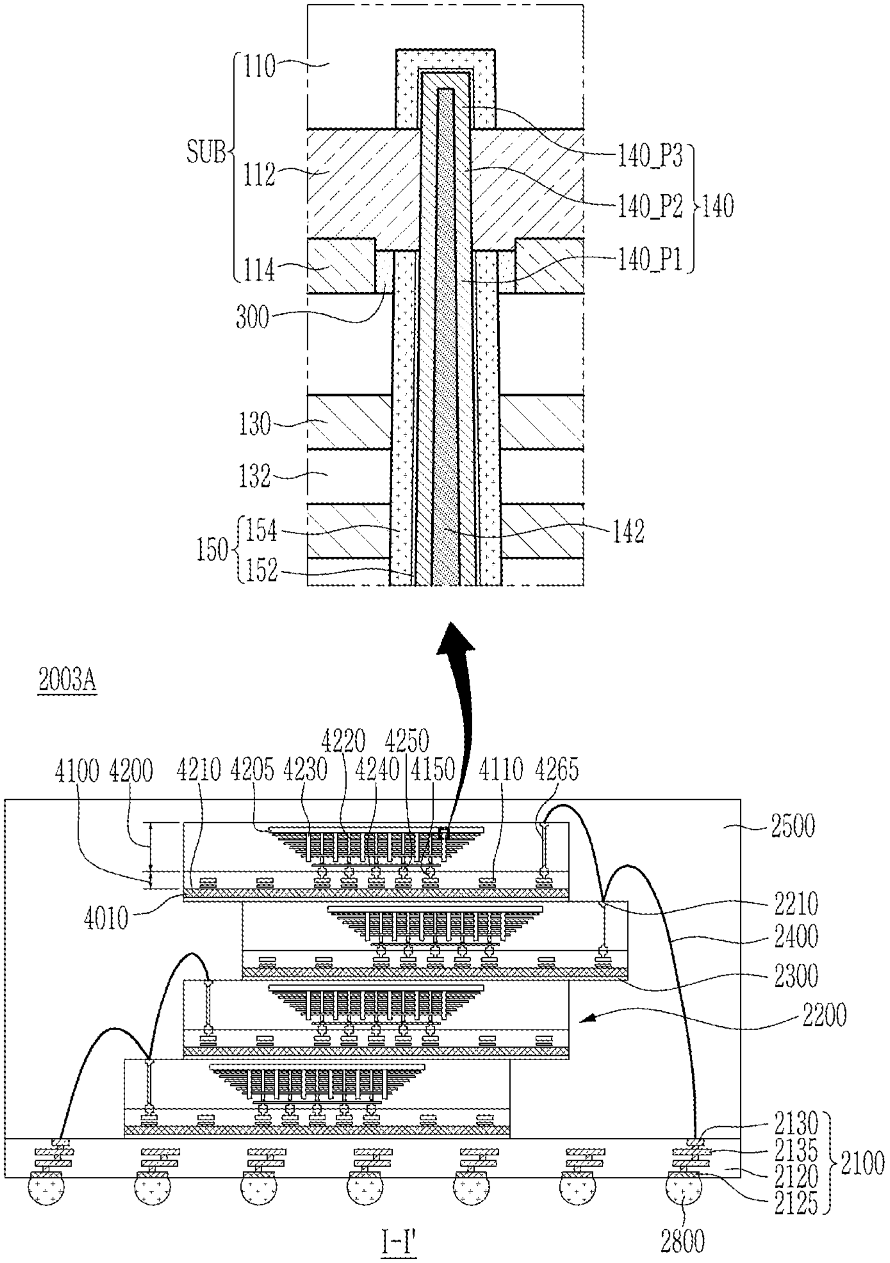

In the gate stacking structure 120, the gate electrode 130 may include a lower gate electrode 130L, a memory cell gate electrode 130M, and an upper gate electrode 130U sequentially positioned on the second substrate SUB while facing the circuit region 200*a* from the second substrate SUB. That is, as shown in FIG. 25, the gate stacking structure 120 is sequentially stacked to the lower part of the second substrate SUB on the drawing, thereby having an upside down shape compared with the gate stacking structure 120 shown in FIG. 1 to FIG. 5.

Accordingly, the channel pad 144 and the second wire part 180 positioned on the gate stacking structure 120 may be positioned adjacent to the circuit region 200*a*. Additionally, the second junction structure 194 electrically connected to the second wire part 180 may be provided on the surface opposite the circuit region 200*a*. The region other than the second junction structure 194 may be covered by the insulation layer 196. In this way, the second wire part 180 and the second junction structure 194 may be positioned to face the circuit region 200*a* in the cell region 100*a*.

For example, the second junction structure 194 of the cell region 100*a* and the first junction structure 238 of the circuit region 200*a* may be made of aluminum, copper, tungsten, or an alloy containing these. As an example, if the first and second junction structures 238 and 194 include copper, then the cell region 100*a* and the circuit region 200*a* may be connected by a copper-to-copper junction.

FIG. 11 illustrates that the gate stacking structure 120 is composed of a single gate stacking structure, as shown in FIG. 1, and may include a plurality of gate stacking structures. Except as otherwise noted, the description for the structure of the gate stacking structure 120 and the channel structure CH described with reference to FIG. 1 to FIG. 5 may be applied as it is.

The semiconductor device 20 according to one example may include an input/output pad 198 and an input/output connection wire 198*a* electrically connected thereto. The input/output connection wire 198*a* may be electrically connected to some of the second junction structures 194. The input/output pad 198, for example, may be positioned on the insulation layer 198*b* covering the outer surface of the second substrate SUB. A separate input/output pad electrically connected to the circuit region 200*a* may be provided.

Figure 22:
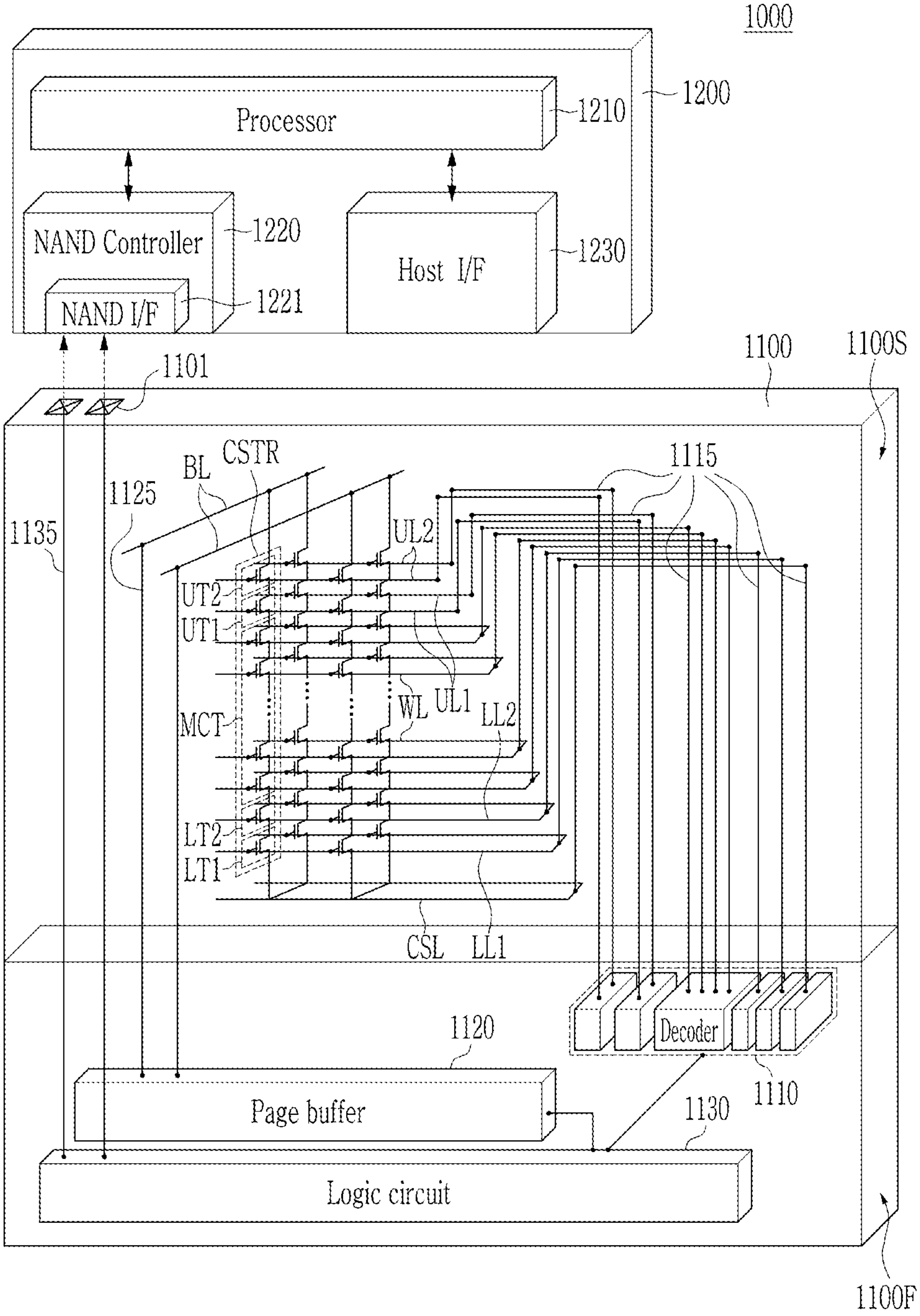
FIG. 22 is a view schematically showing an example electron system including a semiconductor device.

As an example, the circuit region 200*a* and the cell region 100*a* may correspond to the first structure 1100F and the second structure 1100S, respectively, of the semiconductor device 1100 included in the electron system 1000 shown in FIG. 22. Alternatively, the circuit region 200*a* and the cell region 100*a* may correspond to the first structure 4100 and the second structure 4200, respectively, of the semiconductor chip 2003A shown in FIG. 25.

Hereinafter, a method for manufacturing the semiconductor device is described with reference to FIG. 12 to FIG. 21.

FIG. 12 to FIG. 21 are process cross-sectional views of intermediate steps sequentially showing a manufacturing method of a semiconductor device. In FIG. 12 to FIG. 21, for convenience, only a cell array region 102 is shown, and a contact region is omitted. Additionally, only the cell structure is shown, and the circuit region including the peripheral circuit region is omitted.

Below, the manufacturing method of the contact region of the semiconductor device will be mainly described.

Figure 12:
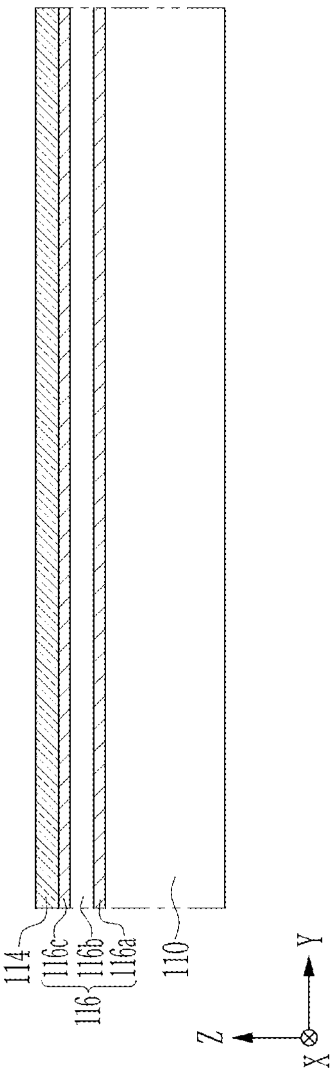
FIG. 12 to FIG. 21 are process cross-sectional views of intermediate steps sequentially showing a manufacturing method of a semiconductor device.

Referring to FIG. 12, a horizontal insulation layer 116 and a third horizontal conductive layer 114 may be stacked on a second horizontal conductive layer 110. A circuit region may be formed below the second horizontal conductive layer 110, and the illustration of the circuit region is omitted. After forming the circuit region first, the second horizontal conductive layer 110 may be formed on the circuit region. However, it is not limited to this, and the structure below the second horizontal conductive layer 110 and the forming method thereof may be changed in various ways.

The second horizontal conductive layer 110 may include a semiconductor material (e.g., polysilicon). For example, the second horizontal conductive layer 110 may include impurity doped polysilicon. However, the material of the second horizontal conductive layer 110 is not limited to this and may be changed in various ways. For example, the second horizontal conductive layer 110 may include a conductive material or a metal silicide.

A horizontal insulation layer 116 may be formed on the second horizontal conductive layer 110 by using an insulating material. The horizontal insulation layer 116 may be made of a single layer or multiple layers. For example, the horizontal insulation layer 116 may be formed by sequentially stacking silicon oxide, silicon nitride, and silicon oxide. As an example, the horizontal insulation layer 116 may include first to third horizontal insulation layers 116*a*, 116*b*, and 116*c* sequentially accumulated on the second horizontal conductive layer 110. The first and third horizontal insulation layers 116*a* and 116*c* may include silicon oxide, and the second horizontal insulation layer 116*b* may include silicon nitride. At least part of the horizontal insulation layer 116 may be a layer that is replaced with a first horizontal conductive layer (112 in FIG. 1) in the subsequent process. That is, the horizontal insulation layer 116 may be formed to include a portion where the first horizontal conductive layer (112 in FIG. 1) will be formed.

Subsequently, a third horizontal conductive layer 114 may be formed on the horizontal insulation layer 116. The third horizontal conductive layer 114 may be formed using a semiconductor material (e.g., polysilicon). For example, the third horizontal conductive layer 114 may include impurity doped polysilicon.

Figure 13:
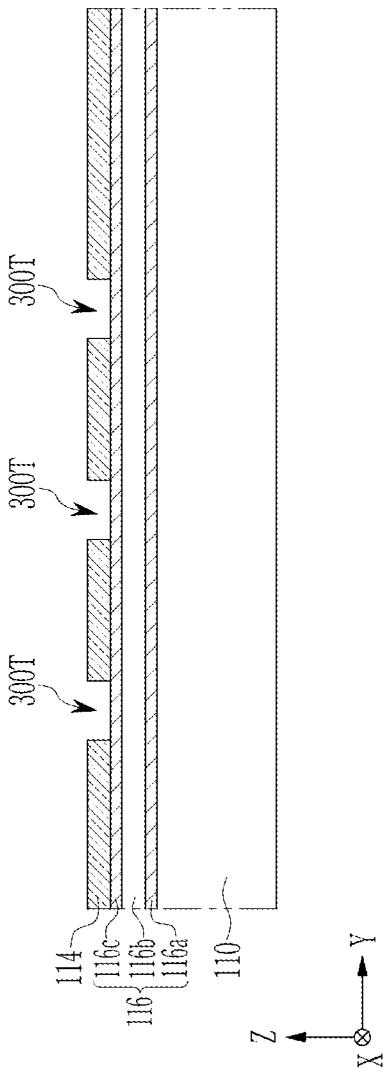

Referring to FIG. 13, a dummy hole 300T may be formed by patterning the third horizontal conductive layer 114. For example, the third horizontal conductive layer 114 may be patterned using a photo and etching process. At least a portion of the upper surface of the third horizontal insulation layer 116*c* may be exposed to the outside by the dummy hole 300T.

Figure 14:
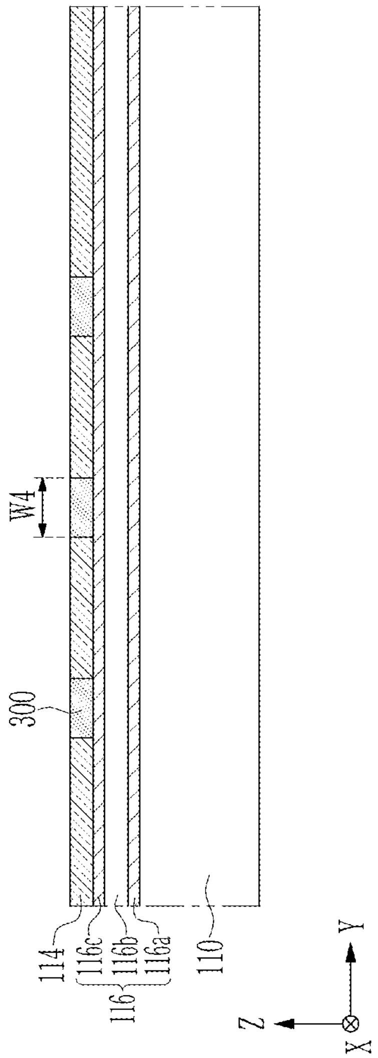

Referring to FIG. 14, the dummy hole 300T may include a dummy pattern 300.

The dummy pattern 300 can cover the upper surface of the third horizontal insulation layer 116*c* and the side surface of the third horizontal conductive layer 114. The dummy pattern 300 may be formed directly above the third horizontal insulation layer 116*c* and be in direct contact with the third horizontal insulation layer 116*c*. The upper surface of dummy pattern 300 can be aligned to the same boundary as the upper surface of the third horizontal conductive layer 114.

The dummy pattern 300 may include a variety of insulating materials. The dummy pattern 300 may include a material with an etch rate similar to the stacking structure 120*d* and/or the horizontal insulation layer 116 to be formed later. As an example, the dummy pattern 300 may have a similar etch rate to an etching solution for etching the gate stacking structure 120. For example, the dummy pattern 300 may include at least one of silicon oxide, silicon nitride, silicon oxynitride, silicon carbon oxide, silicon carbonate nitride, silicon carbide nitride, and aluminum oxide.

Figure 15:
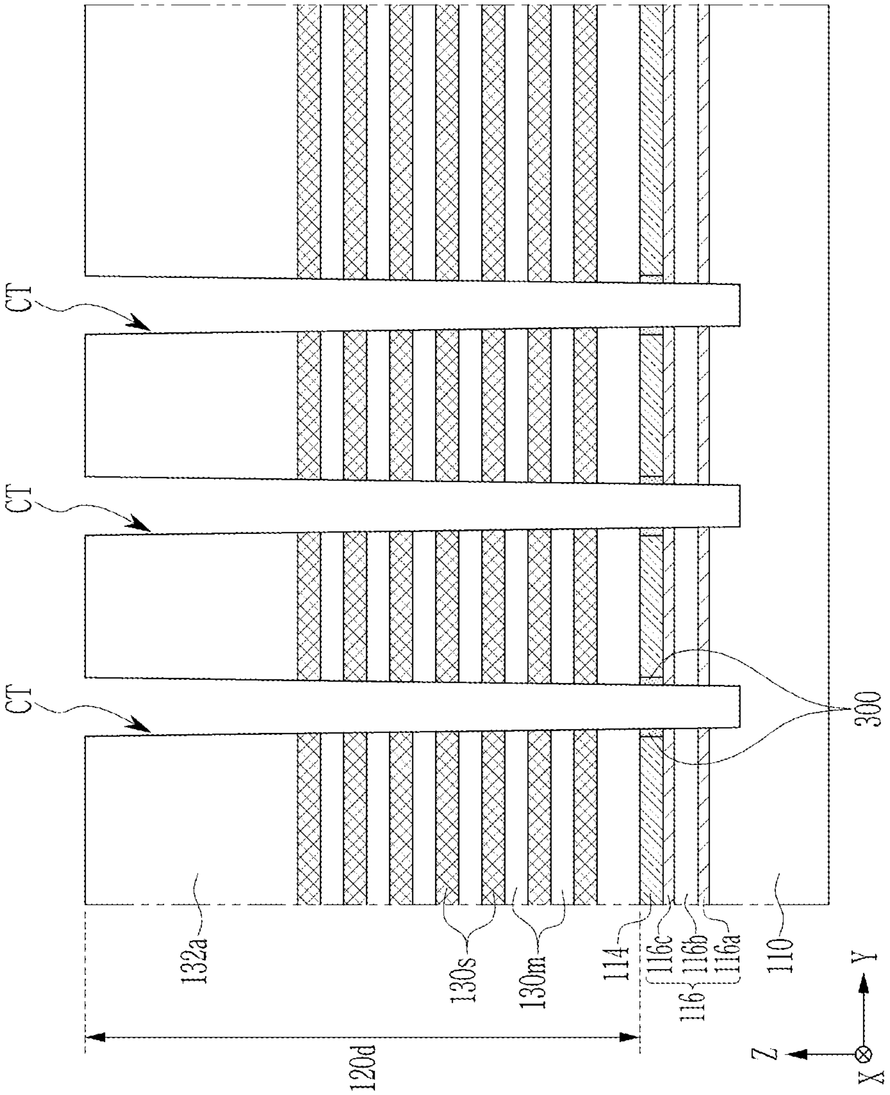

Referring to FIG. 15, first, on the third horizontal conductive layer 114 and the dummy pattern 300, a stacking structure 120*d* can be formed by alternately stacking a plurality of interlayer insulating layers 132*m* and a plurality of sacrificial insulation layers 130*s*. After alternately stacking the interlayer insulating layer 132*m* and the sacrificial insulation layer 130*s*, a first upper insulation layer 132*a* may be formed on the top. The sacrificial insulation layer 130*s* may be formed of a different material than the interlayer insulating layer 132*m*. The interlayer insulating layer 132*m* may include silicon oxide, silicon nitride, silicon oxynitride, low dielectric constant material, etc., and the sacrificial insulation layer 130*s* may include at least one of silicon, silicon oxide, silicon carbide, and silicon nitride, but it may be made of a different material than the interlayer insulating layer 132*m*. For example, the interlayer insulating layer 132*m* may include silicon oxide, and the sacrificial insulation layer 130*s* may include silicon nitride. The sacrificial insulation layer 130*s* may be a layer replaced by a gate electrode (130 in FIG. 1) in a subsequent process. That is, the sacrificial insulation layer 130*s* may be formed to correspond to the portion where the gate electrode (130 in FIG. 1) will be formed.

In the drawing, the stacking structure 120*d* is shown to be formed of a single stacking structure, but it is not limited to this, and the stacking structure 120*d* may include two or more stacking structures.

Next, the stacking structure 120*d* is patterned to form a channel hole CT. The stacking structure 120*d* may be penetrated by the channel hole CT. In the process of patterning the stacking structure 120*d*, the dummy pattern 300, the horizontal insulation layer 116, and the second horizontal conductive layer 110 may be patterned together. The dummy pattern 300 and the horizontal insulation layer 116 may be penetrated by the channel hole CT, and the second horizontal conductive layer 110 may not be penetrated. In other words, the depth of the channel hole CT formed in the second horizontal conductive layer 110 may be smaller than the thickness of the second horizontal conductive layer 110. The channel hole CT may not be formed in the third horizontal conductive layer 114. Therefore, the channel hole CT with the substantially same planar shape may be formed in the second horizontal conductive layer 110, the horizontal insulation layer 116, the dummy pattern 300, and the first stacking structure 120*d*.

In an implementation, the dummy pattern 300 may include a material having a similar etch rate as the stacking structure 120*d* and/or the horizontal insulation layer 116. Therefore, in the process of forming the channel hole CT passing through the dummy pattern 300, the sidewalls of the channel hole CT may be formed to extend straightly in one direction. That is, a bending portion or a protruding portion may not be formed in the channel hole CT portion penetrating the dummy pattern 300. For example, the sidewall of the channel hole CT overlapping the stacking structure 120*d* in the second direction (the Y direction), the sidewall of the channel hole CT overlapping the dummy pattern 300 in the second direction (the Y direction), and the sidewall of the channel hole CT overlapping the horizontal insulation layer 116 in the second direction (the Y direction) may extend straightly on a cross-section.

Meanwhile, in a case of a comparative example in which the semiconductor device 10 does not have the dummy pattern 300, a channel hole CT may be formed to penetrate the third horizontal conductive layer 114. At this time, because the third horizontal conductive layer 114 includes a material whose etch rate is different from that of the stacking structure 120*d* for the etching solution that etches the part of the stacking structure 120*d*, during the process of forming the channel hole CT, the third horizontal conductive layer 114 may remain within the channel hole CT.

Figure 16:
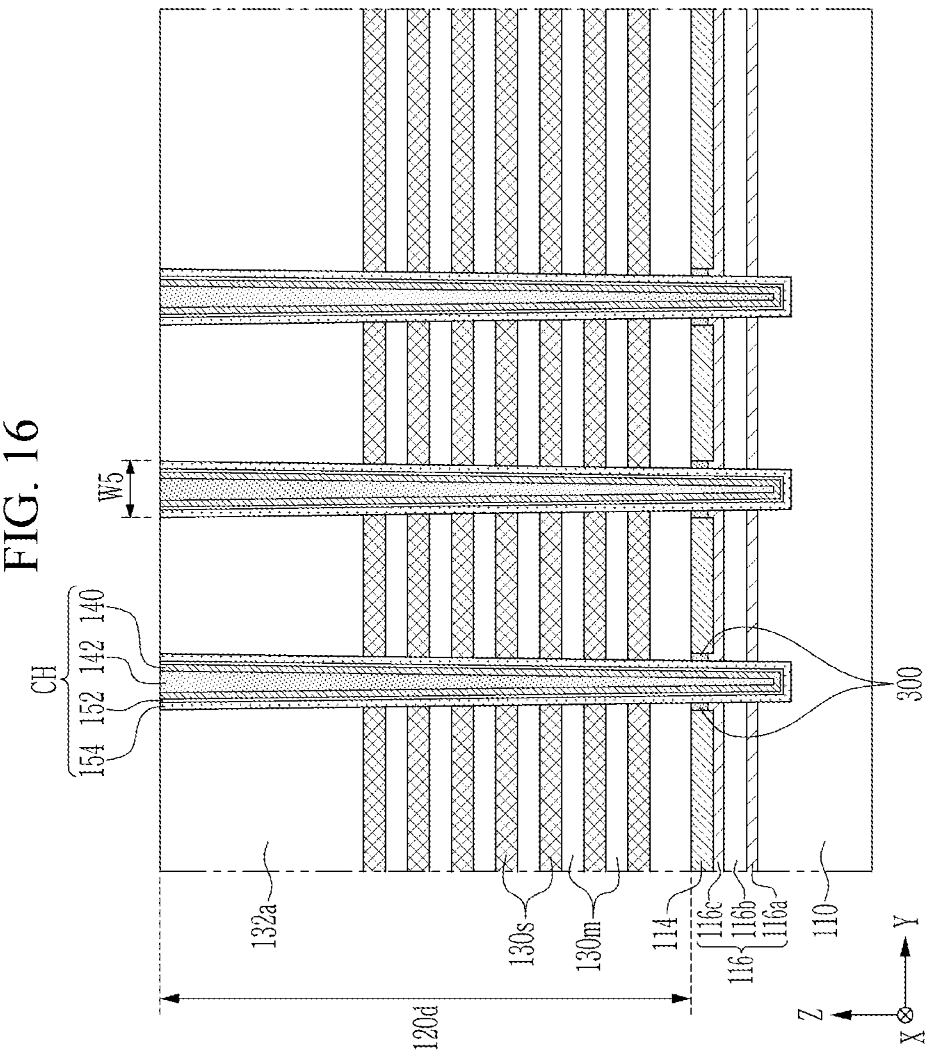

Referring to FIG. 16, a channel structure CH may be formed in the channel hole CT. A gate dielectric layer 150, a channel layer 140, and a core insulation layer 142 may be accumulated sequentially within the channel hole CT. In the step of forming the gate dielectric layer 150, a ferroelectric layer 154 and a channel insulation layer 152 may be accumulated sequentially to form the gate dielectric layer 150 including a plurality of layers. However, it is not limited to this, and like the implementation FIG. 7, the ferroelectric material may be formed in multiple layers. Also, as in the implementation of FIG. 8, the gate dielectric layer 150 may be formed by sequentially accumulating the charge inflow layer (156 in FIG. 8), ferroelectric layer 154 and channel insulation layer (152 in FIG. 8). Also, like the implementation of FIG. 10, the gate dielectric layer 150 may be formed by sequentially accumulating the blocking layer (157 of FIG. 10), the charge storing layer (155 of FIG. 10), the ferroelectric layer 154, and the channel insulation layer 152.

In an implementation, the fifth width W5 along the second direction (the Y direction) of the channel structure CH may be smaller than the fourth width (W4 in FIG. 14) along the second direction (the Y direction) of the dummy pattern 300. Here, the fifth width W5 along the second direction (the Y direction) of the channel structure CH may be the maximum width along the second direction (the Y direction) of the channel structure CH. Accordingly, the channel structure CH may be formed to penetrate the dummy pattern 300.

The ferroelectric layer 154 and the channel layer 140 may be formed to have a conformal shape within the channel hole CT with a predetermined thickness. The ferroelectric layer 154 and the channel layer 140 may be formed to cover the inner sidewall and the bottom surface of the channel hole CT. For example, the thickness of the ferroelectric layer 154 along the second direction (the Y direction) may be greater than the thickness of the channel layer 140 along the second direction (the Y direction). For example, the thickness of the ferroelectric layer 154 along the second direction (the Y direction) may be 100 nm to 200 nm, but is not limited thereto. At this time, along the inclined interior wall surface of the channel hole CT, the ferroelectric layer 154 and the channel layer 140 may also have inclined side surfaces.

In an implementation, the ferroelectric layer 154 and the channel layer 140 may extend straightly in one direction within the second substrate SUB. This is because, as described above, the channel hole CT extends straightly in one direction, and the ferroelectric layer 154 and the channel layer 140 within the channel hole CT are formed to have the conformal shape.

Even when the ferroelectric layer 154 of the semiconductor device 10 is formed with a predetermined thickness, since the channel hole CT is formed passing through the dummy pattern 300, sufficient space may be provided for the channel layer 140 to be formed in the portion where the channel hole CT overlaps the dummy pattern 300 in the second direction (the Y direction). That is, the channel layer 140 may be formed to extend straightly without being folded or bent in the portion overlapping the dummy pattern 300 in the second direction (the Y direction).

Accordingly, the thickness of the gate dielectric layer 150 and the channel layer 140 along the second direction (the Y direction) may be the same at any point along the third direction (the Z direction). For example, the thickness of the ferroelectric layer 154 and the channel layer 140 according to the second direction (the Y direction) overlapping the stacking structure 120*d* in the second direction (the Y direction) and the thickness of the ferroelectric layer 154 and the channel layer 140 according to the second direction (the Y direction) overlapping the dummy pattern 300 in the second direction (the Y direction) may be substantially equivalent.

The interior of the channel hole CT may not be completely filled by the gate dielectric layer 150 and the channel layer 140. The portion of the channel hole CT that is not filled by the gate dielectric layer 150 and the channel layer 140 may be filled by the core insulation layer 142. Although not shown in the drawing, a channel pad may be formed on the gate dielectric layer 150, the channel layer 140, and the core insulation layer 142.

Figure 17:
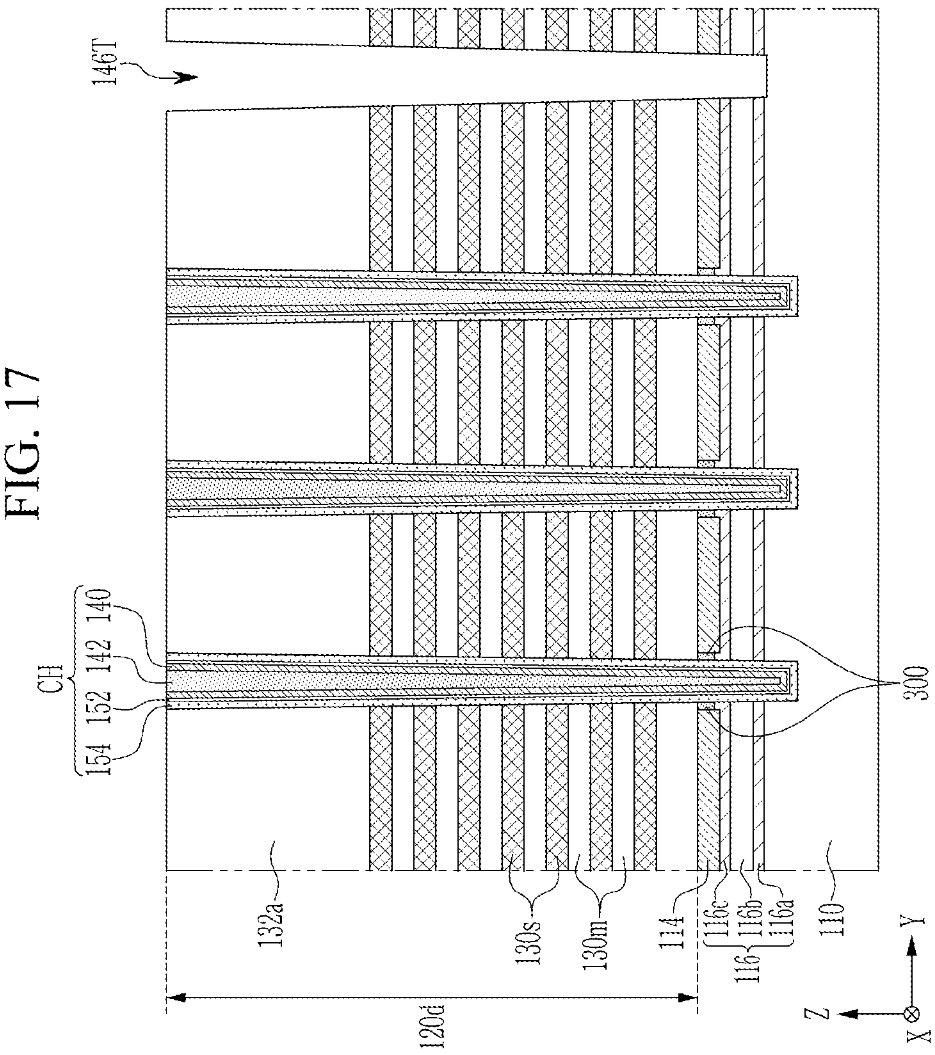

Referring to FIG. 17, a separation trench 146T may be formed in the stacking structure 120*d* and the horizontal insulation layer 116. By forming a mask pattern on the stacking structure 120*d* and the horizontal insulation layer 116 and etching the stacking structure 120*d* and the horizontal insulation layer 116, the separation trench 146T passing through the stacking structure 120*d* and the horizontal insulation layer 116 may be formed. The side of each layer constituting the stacking structure 120*d* may be exposed by the separation trench 146T. Additionally, the side of each layer constituting the horizontal insulation layer 116 may be exposed by the separation trench 146T. At this time, a part of the second horizontal conductive layer 110 may be etched together, but is not limited thereto.

The separation trench 146T may be formed to penetrate all layers constituting the stacking structure 120*d*. Additionally, the separation trench 146T may penetrate the horizontal insulation layer 116. The separation trench 146T may extend in one direction (e.g., the first direction (the X direction)), and a plurality of separation trenches 146T may be spaced apart from each other along a direction (e.g., the second direction (the Y direction)) that intersects the first direction.

Figure 18:
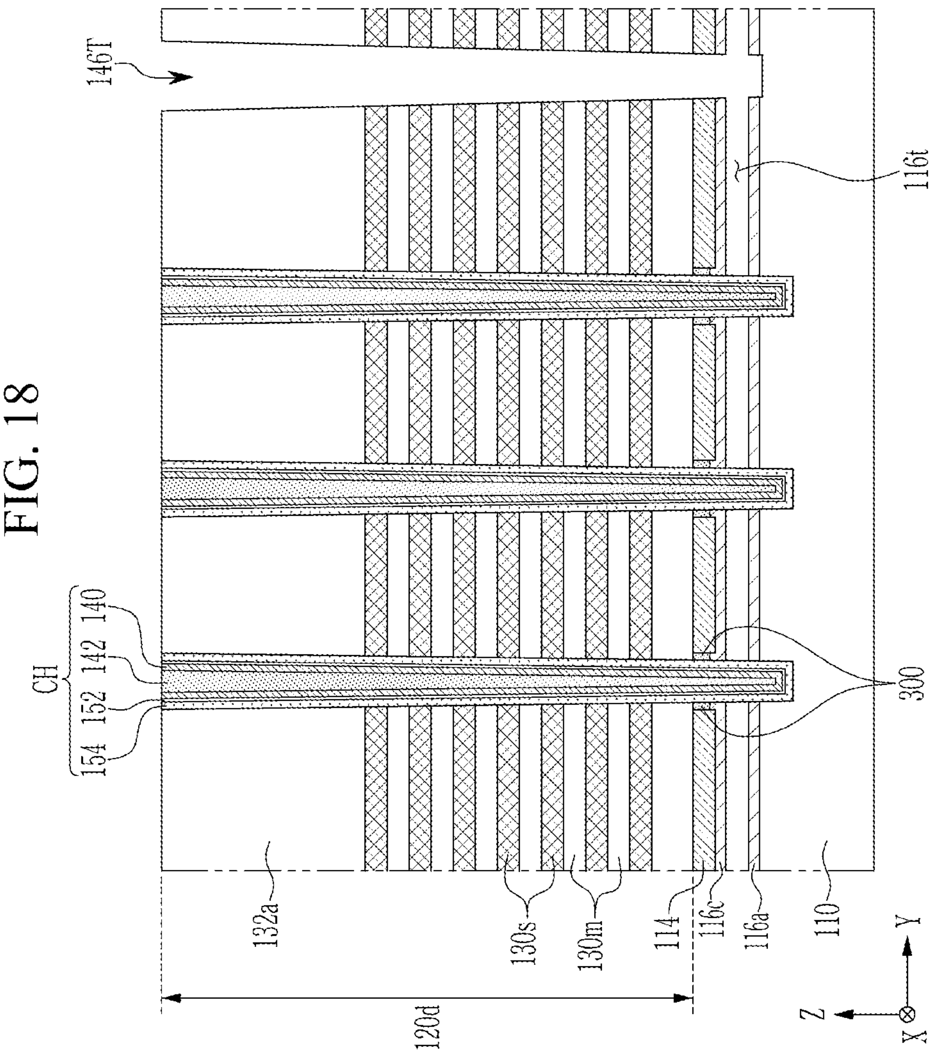
Figure 19:
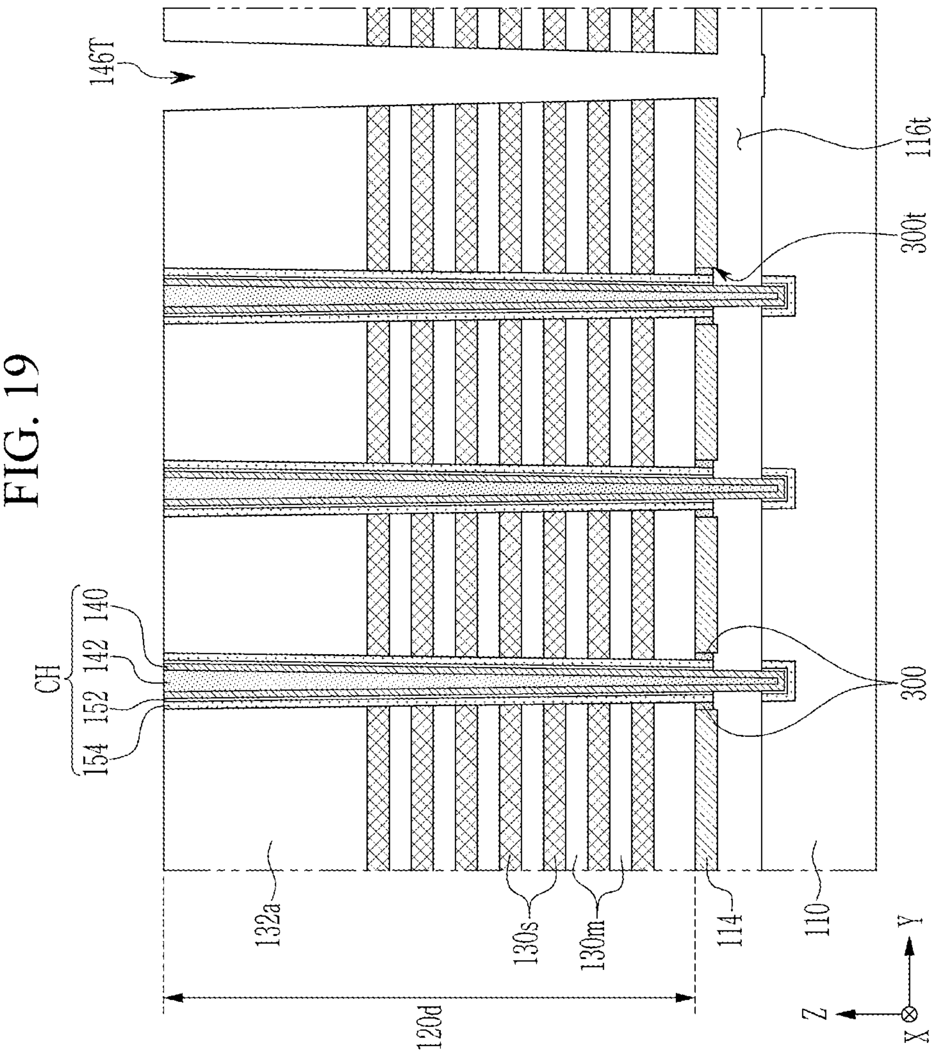

Referring to FIG. 18 and FIG. 19, the horizontal insulation layer 116 may be removed, and a first horizontal conductive layer 112 may be formed in the space where the horizontal insulation layer 116 is removed.

First, the second horizontal insulation layer 116*b* exposed by the separation trench 146T may be removed. The process of removing the second horizontal insulation layer 116*b* may be done using the space exposed by the exposed separation trench 146T and using a pullback process. Accordingly, the horizontal trench 116*t* in which the upper surface of the first horizontal insulation layer 116*a* and the bottom surface of the third horizontal insulation layer 116*c* are exposed may be formed. At this time, a portion of the side surface of the ferroelectric layer 154 of the channel structure CH may be exposed.

Subsequently, the first horizontal insulation layer 116*a* and the third horizontal insulation layer 116*c* exposed by the horizontal trench 116*t* may be removed. The process of removing the first horizontal insulation layer 116*a* and the third horizontal insulation layer 116*c* may be done using the space exposed by the separation trench 146T and using the pullback process. At this time, in the process of removing the first horizontal insulation layer 116*a* and the third horizontal insulation layer 116*c*, a part of the dummy pattern 300 may be removed together. For example, at least part of the bottom surface of the dummy pattern 300 may be removed together.

Next, a part of the channel structure CH exposed by the horizontal trench 116*t* may be removed. The portion of the ferroelectric layer 154 and the channel insulation layer 152 exposed by the horizontal trench 116*t* may be sequentially etched. Accordingly, the channel layer 140 may be exposed.

Figure 20:
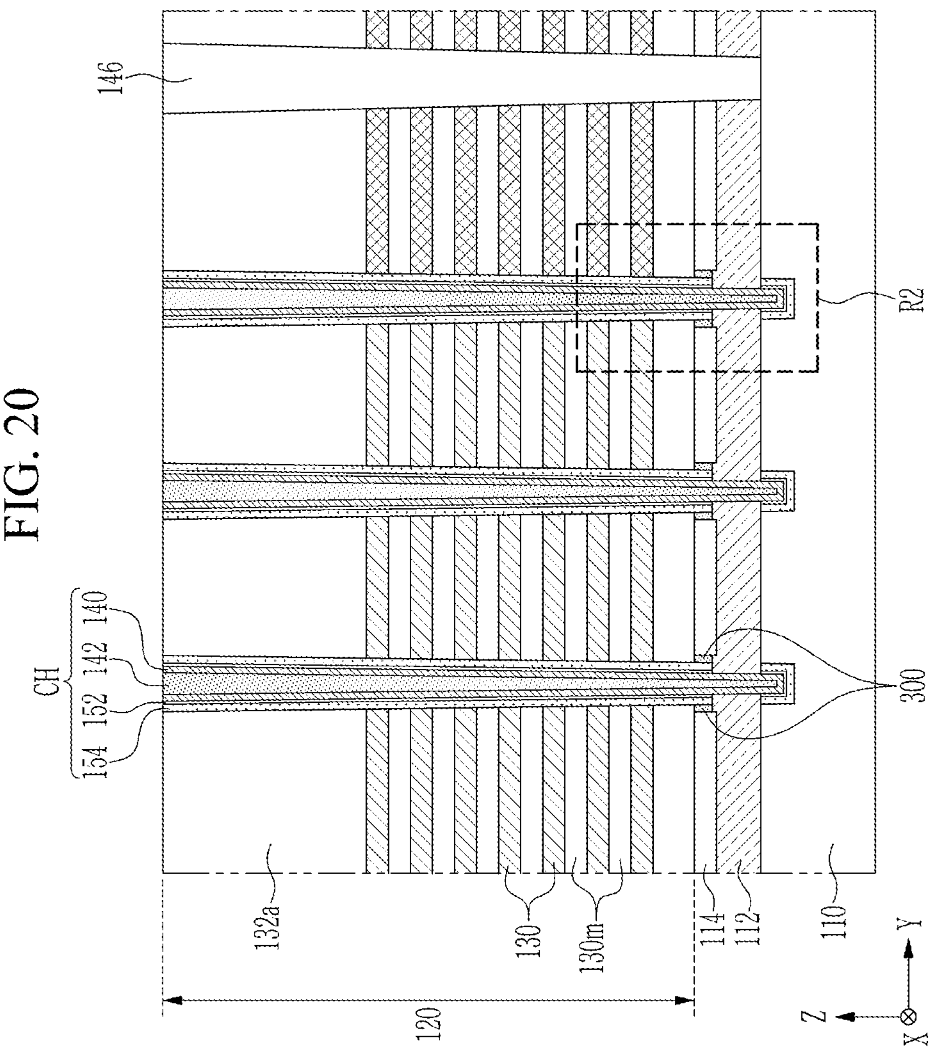
Figure 21:
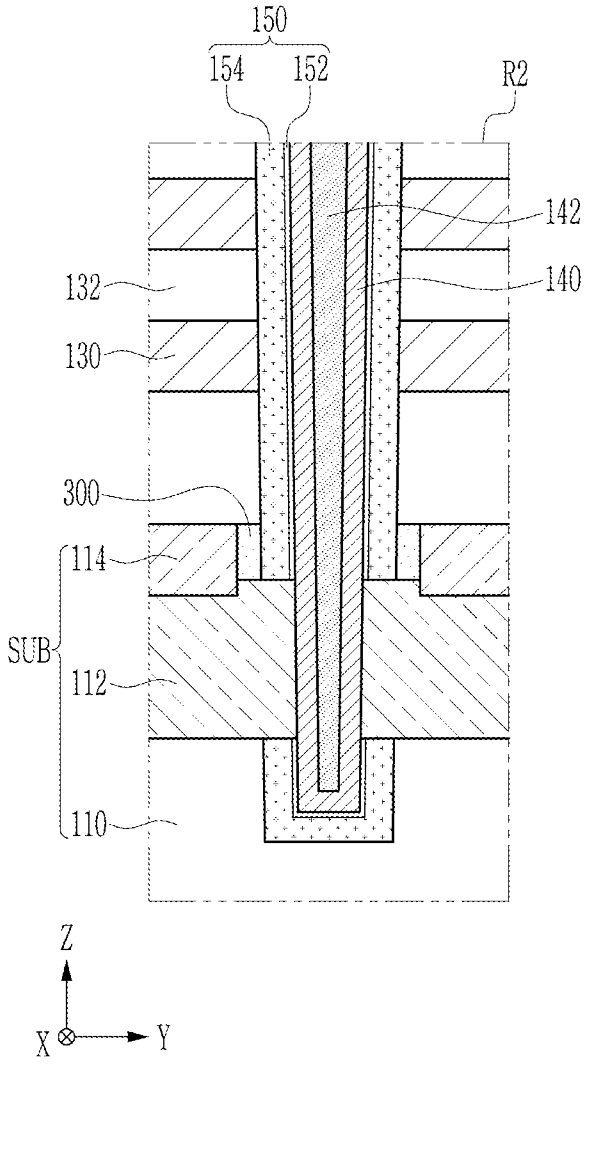

Referring to FIG. 20 and FIG. 21, the horizontal trench 116*t*, may include the first horizontal conductive layer 112. The first horizontal conductive layer 112 may be positioned between the second horizontal conductive layer 110 and the third horizontal conductive layer 114. At this time, the bottom surface of the first horizontal conductive layer 112 may be in contact with the second horizontal conductive layer 110, and the upper surface of the first horizontal conductive layer 112 may be in contact with the third horizontal conductive layer 114. The first horizontal conductive layer 112 may include impurity doped polysilicon. The first horizontal conductive layer 112 may function as a common source line along with the second horizontal conductive layer 110 and the third horizontal conductive layer 114.

Subsequently, the sacrificial insulation layer 130*s* exposed by the separation trench 146T may be removed, and the gate electrode 130 may be formed within the space where the sacrificial insulation layer 130*s* has been removed. After removing the sacrificial insulation layer 130*s* by using an etching process, the gate electrode 130 may be formed by depositing metallic materials such as tungsten (W), copper (Cu), aluminum (Al), etc. The gate electrode 130 may include a lower gate electrode 130L, a memory cell gate electrode 130M, and an upper gate electrode 130U sequentially positioned from the second substrate SUB. The lower gate electrode 130L may be used as the gate electrode of the ground selection transistor, the memory cell gate electrode 130M may configure the memory cell, and the upper gate electrode 130U may be used as the gate electrode of the string selection transistor.

In the process of forming the channel structure CH of the semiconductor device 10, by removing a part of the third horizontal conductive layer 114 to form the dummy pattern 300 and forming the channel hole CT passing through the dummy pattern 300, the channel hole CT may be extended straightly along one direction. In other words, the channel hole CT may not be folded or bent in the portion that overlaps the dummy pattern 300 in the second direction (the Y direction).

Accordingly, even when the ferroelectric layer 154 has a predetermined thickness to function as a non-volatile memory layer, sufficient space may be provided for the formation of the channel layer 140 in the portion where the channel structure CH overlaps with the dummy pattern 300 in the second direction (the Y direction). Accordingly, the ferroelectric layer 154 and the channel layer 140 of the semiconductor device 10 may be extended straightly in one direction within the second substrate SUB, and the reliability of the semiconductor device 10 may be improved.

Next, an electron system including the semiconductor device will be described with reference to FIG. 22.

FIG. 22 is a view schematically showing an electron system including a semiconductor device.

As shown in FIG. 22, an electron system 1000 may include a semiconductor device 1100 and a controller 1200 electrically connected to the semiconductor device 1100. The electron system 1000 may be a storage device including one or a plurality of semiconductor devices 1100 or an electronic device including a storage device. For example, the electron system 1000 may be a solid state drive device (SSD) device, a universal serial bus (USB), a computing system, a medical device, or a communication device including one or plurality of semiconductor devices 1100.

The semiconductor device 1100 may be a non-volatile memory device, for example, may be the NAND flash memory device described with reference to FIG. 1 through FIG. 5 and to FIG. 11. The semiconductor device 1100 may include a first structure 1100F and a second structure 1100S on the first structure 1100F. In an example implementation, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, a word line WL, first and second gate upper lines UL1 and UL2, first and second gate lower lines LL1 and LL2, and a memory cell string CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may vary.

In an example implementation, the lower transistors LT1 and LT2 may include ground selection transistors, and the upper transistors UT1 and UT2 may include string selection transistors. The first and second gate lower lines LL1 and LL2 may be the gate electrodes of the lower transistors LT1 and LT2, respectively. The word line WL may be the gate electrode of the memory cell transistor MCT, and the gate upper lines UL1 and UL2 may be the gate electrodes of upper transistors UT1 and UT2, respectively.

The common source line CSL, the first and second gate lower lines LL1 and LL2, the word line WL, and the first and second gate upper lines UL1 and UL2 may be electrically connected to the decoder circuit 1110 through the first connection wire 1115 extending to the second structure 1100S from the first structure 1100F. The bit line BL may be electrically connected to the page buffer 1120 through the second connection wire 1125 that extends from the first structure 1100F to the second structure 1100S.

In the first structure 1100F, the decoder circuit 1110 and the page buffer 1120 may perform control operations on at least one memory cell transistor selected from the plurality of memory cell transistors MCT. The decoder circuit 1110 and the page buffer 1120 may be controlled by the logic circuit 1130. The semiconductor device 1100 may communicate with the controller 1200 through the input/output pad 1101 that is electrically connected to the logic circuit 1130. The input/output pad 1101 may be electrically connected to the logic circuit 1130 through the input/output connection wire 1135 that extends from the first structure 1100F to the second structure 1100S.

The controller 1200 may include a processor 1210, a NAND controller 1220, and a host interface 1230. The electron system 1000 may include a plurality of semiconductor devices 1100, and in this case, the controller 1200 may control the plurality of semiconductor devices 1100.

The processor 1210 may control the overall operation of the electron system 1000, including the controller 1200. The processor 1210 may be operated according to a predetermined firmware and may be accessed to the semiconductor device 1100 by controlling the NAND controller 1220. The NAND controller 1220 may include a NAND interface 1221 that processes a communication with the semiconductor device 1100. Through the NAND interface 1221, control instructions for controlling the semiconductor device 1100, data to be written to the memory cell transistor MCT of the semiconductor device 1100, data to be read from the memory cell transistor MCT of the semiconductor device 1100, etc. may be transmitted. The host interface 1230 may provide a communication function between the electron system 1000 and an external host. When receiving a control instruction from an external host through the host interface 1230, the processor 1210 may control the semiconductor device 1100 in response to the control instruction.

Figure 23:
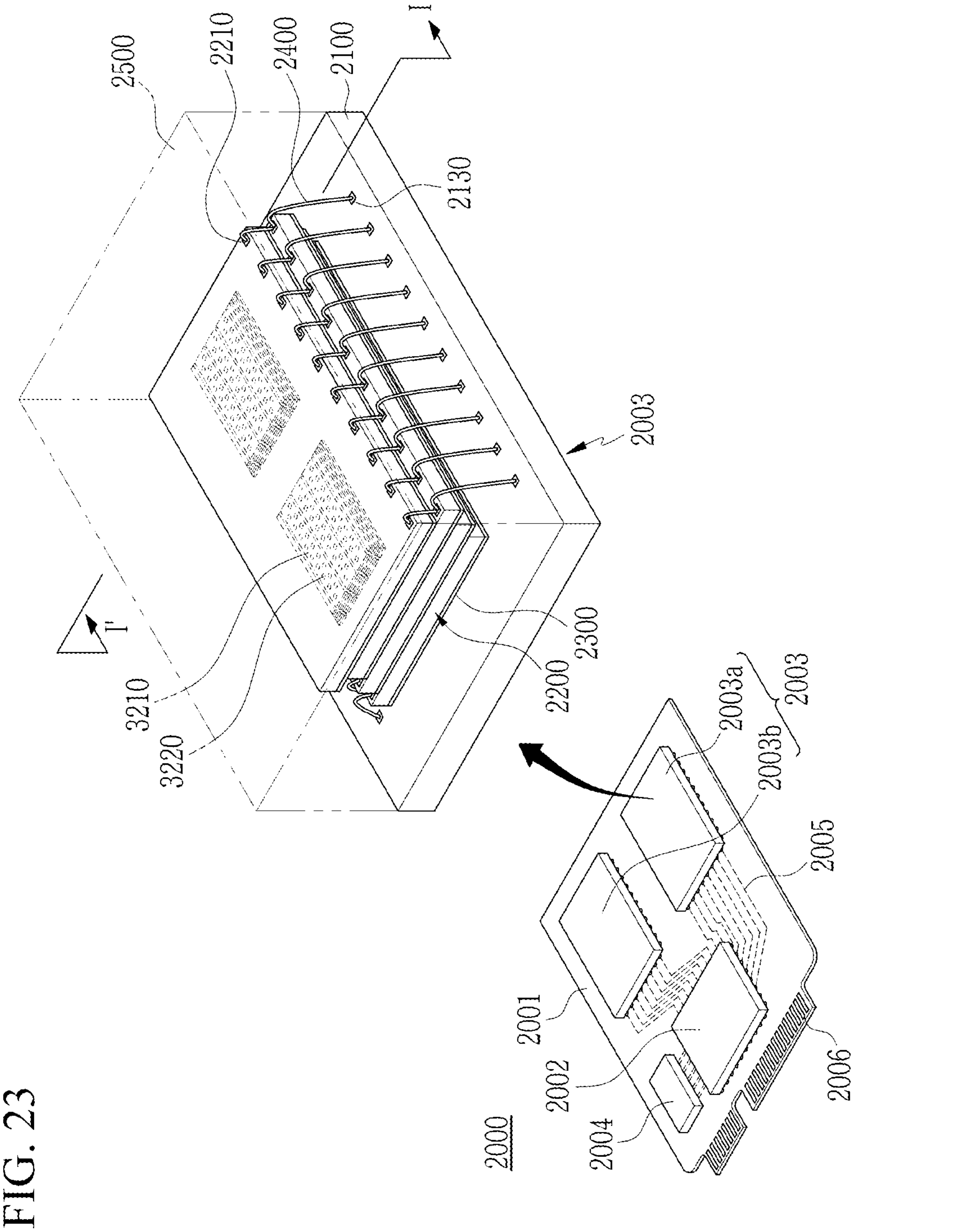
FIG. 23 is a perspective view schematically showing an example electron system including a semiconductor device.

FIG. 23 is a perspective view schematically showing an electron system including a semiconductor device.

As shown in FIG. 23, an electron system 2000 may include a main substrate 2001, and a controller 2002, one or more semiconductor packages 2003, and a DRAM 2004, which are mounted on the main substrate 2001. The semiconductor package 2003 and the DRAM 2004 may be connected to the controller 2002 by the wire pattern 2005 formed on the main substrate 2001.

The main substrate 2001 may include a connector 2006 that includes a plurality of pins to be coupled to an external host. The number and arrangement of plurality of pins in the connector 2006 may vary depending on the communication interface between the electron system 2000 and the external host. In an implementation, the electron system 2000 may communicate with an external host according to one among interfaces such as USB (Universal Serial Bus), PCI-Express (Peripheral Component Interconnect Express), SATA (Serial Advanced Technology Attachment), and M-Phy for UFS (Universal Flash Storage). In an implementation, the electron system 2000 may operate with a power supplied from an external host through the connector 2006. The electron system 2000 may further include a power management integrated circuit (PMIC) that distributes a power supplied from the external host to the controller 2002 and the semiconductor package 2003.

The controller 2002 may record a data in the semiconductor package 2003 or read a data from the semiconductor package 2003, and may improve the operation speed of electron system 2000.

The DRAM 2004 may be a buffer memory to alleviate the speed difference between a semiconductor package 2003 that is a data storage space, and an external host. The DRAM 2004 included in the electron system 2000 may also operate as a type of a cache memory and provide a space to temporarily store a data during the control operations for the semiconductor package 2003. When the electron system 2000 includes the DRAM 2004, the controller 2002 may further include a DRAM controller for controlling the DRAM 2004 in addition to a NAND controller for controlling the semiconductor package 2003.

The semiconductor package 2003 may include first and second semiconductor packages 2003*a* and 2003*b* separated from each other. The first and second semiconductor packages 2003*a* and 2003*b* may each be a semiconductor package including a plurality of semiconductor chips 2200. Each of the first and second semiconductor packages 2003*a* and 2003*b* may include a package substrate 2100, a semiconductor chip 2200 on the package substrate 2100, an adhesive layer 2300 disposed on the bottom surface of each semiconductor chip 2200, a connection structure 2400 electrically connecting the semiconductor chip 2200 and the package substrate 2100, and a molding layer 2500 covering the semiconductor chip 2200 and the connection structure 2400 on the package substrate 2100.

The package substrate 2100 may be a printed circuit board including a package upper pad 2130. Each semiconductor chip 2200 may include an input/output pad 2210. The input/output pad 2210 may correspond to an input/output pad 1101 of FIG. 22. Each semiconductor chip 2200 may include a gate stacking structure 3210 and a channel structure 3220. The semiconductor chip 2200 may include the semiconductor device described with reference to FIG. 1 through FIG. 5, and to FIG. 11.

In an implementation, the connection structure 2400 may be a bonding wire that electrically connects the input/output pad 2210 and the package upper pad 2130. Therefore, in each first and second semiconductor package 2003*a* and 2003*b*, the semiconductor chips 2200 may be electrically connected to each other using a bonding wire method, and may be electrically connected to the package upper pad 2130 of the package substrate 2100. In each of the first and the second semiconductor packages 2003*a* and 2003*b*, the semiconductor chips 2200 may be electrically connected to each other by a connection structure including a through electrode (e.g., Through Silicon Via, TSV) instead of the bonding wire type connection structure 2400.

In an example implementation, the controller 2002 and the semiconductor chip 2200 may be included in one package. For example, the controller 2002 and the semiconductor chip 2200 may be mounted on a separate interposer substrate different from the main substrate 2001, and the controller 2002 and the semiconductor chip 2200 may be connected to each other by a wire formed on the interposer substrate.

Figure 24:
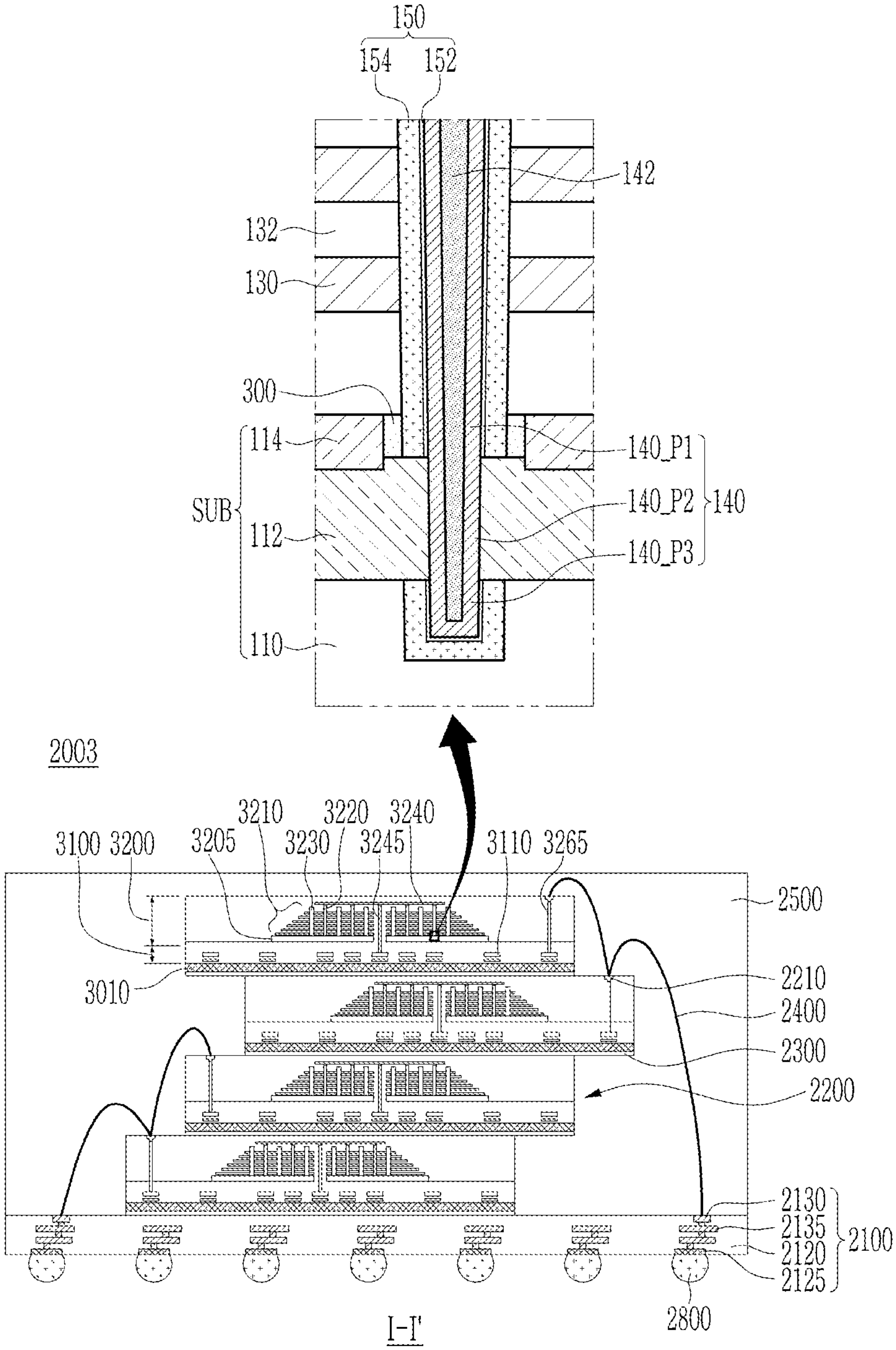
FIG. 24 and FIG. 25 are cross-sectional views schematically illustrating a semiconductor package.

FIG. 24 and FIG. 25 are cross-sectional views each schematically showing a semiconductor package. FIG. 24 and FIG. 25, respectively, describe an example of the semiconductor package 2003 of FIG. 23, and conceptually represent the region where the semiconductor package 2003 of FIG. 23 is taken along a cutting line I-I'.

Referring to FIG. 24, in the semiconductor package 2003, the package substrate 2100 may be a printed circuit board. The package substrate 2100 may include a package substrate body part 2120, a package upper pad 2130 disposed on the upper surface of the package substrate body part 2120, a lower pad 2125 disposed on the lower surface of the package substrate body part 2120 or exposed through the lower surface, and an inner wire 2135 electrically connecting the upper pad 2130 and the lower pad 2125 inside the package substrate body part 2120. The upper pad 2130 may be electrically connected to the connection structure 2400. The lower pad 2125 may be connected to a wire pattern 2005 of a main substrate 2001 of the electron system 2000 through a conductive connection 2800 as shown in FIG. 23.

The semiconductor chip 2200 may include a semiconductor substrate 3010, and a first structure 3100 and a second structure 3200 sequentially stacked on the semiconductor substrate 3010, respectively. The first structure 3100 may include a peripheral circuit region including peripheral wires 3110. The second structure 3200 may include a common source line 3205, a gate stacking structure 3210 on the common source line 3205, a channel structure 3220 and a separation structure 3230 penetrating the gate stacking structure 3210, a bit line 3240 electrically connected to the channel structure 3220, and a gate connection wire electrically connected to a word line (a numeral number WL of FIG. 26) of the gate stacking structure 3210.

In the semiconductor chip 2200 or the semiconductor device, even if the ferroelectric layer 154 has a predetermined thickness to function as a non-volatile memory layer, sufficient space may be provided for the formation of the channel layer 140 in the portion where the channel structure CH overlaps with the dummy pattern 300 in the second direction (the Y direction). Accordingly, the ferroelectric layer 154 and the channel layer 140 of the semiconductor device 10 may be extended straightly in one direction within the second substrate SUB, and the reliability of the semiconductor device 10 may be improved.

Each semiconductor chip 2200 may include a through wire 3245 that is electrically connected to the peripheral wire 3110 of the first structure 3100 and extends into the second structure 3200. The through wire 3245 may penetrate the gate stacking structure 3210 and may be further disposed on the outside of the gate stacking structure 3210. Each of the semiconductor chips 2200 may further include an input/output connection wire 3265 that is electrically connected to the peripheral wire 3110 of the first structure 3100 and extends into the second structure 3200, and an input/output pad 2210 that is electrically connected to the input/output connection wire 3265.

In an implementation, a plurality of semiconductor chips 2200 in the semiconductor package 2003 may be electrically connected to each other by a connection structure 2400 in a form of a bonding wire. As another example, the plurality of semiconductor chip 2200 or the plurality of portions constituting it may be electrically connected by a connection structure including a through electrode (e.g., a Through Silicon Via, TSV).

Referring to FIG. 25, in the semiconductor package 2003A, each semiconductor chip 2200 may include a semiconductor substrate 4010, a first structure 4100 on the semiconductor substrate 4010, and a second structure 4200 joined to the first structure 4100 on the first structure 4100 by a wafer bonding type.

The first structure 4100 may include a peripheral circuit region including a peripheral wire 4110 and a first junction structure 4150. The second structure 4200 may include a common source line 4205, a gate stacking structure 4210 between the common source line 4205 and the first structure 4100, a channel structure 4220 and a separation structure 4230 penetrating the gate stacking structure 4210, and a second junction structure 4250 electrically connected to a word line (a numeral WL in FIG. 22, hereinafter the same) of the channel structure 4220 and the gate stacking structure 4210. For example, the second junction structure 4250 may be electrically connected to the channel structure 4220 and the word line WL, respectively, through the bit line 4240 electrically connected to the channel structure 4220 and the gate connection wire electrically connected to the word line WL. The first junction structure 4150 of the first structure 4100 and the second junction structure 4250 of the second structure 4200 may be joined by being in contact with each other. The junction portion of the first junction structure 4150 and the second junction structure 4250 may be formed of copper (Cu), for example.

In the semiconductor chip 2200 or the semiconductor device, even when the ferroelectric layer 154 has a predetermined thickness to function as a non-volatile memory layer, sufficient space may be provided for the formation of the channel layer 140 in the portion where the channel structure CH overlaps the dummy pattern 300 in the second direction (the Y direction). Accordingly, the ferroelectric layer 154 and the channel layer 140 of the semiconductor device 10 may be extended straightly in one direction within the second substrate SUB, and the reliability of the semiconductor device 10 may be improved.

Each semiconductor chip 2200 may further include an input/output pad 2210 and an input/output connection wire 4265 below the input/output pad 2210. The input/output connection wire 4265 may be electrically connected to some of the second junction structures 4250.

In an implementation, a plurality of semiconductor chips 2200 in semiconductor package 2003 may be electrically connected to each other by a connection structure 2400 in a form of a bonding wire. As another example, the plurality of semiconductor chip 2200 or the plurality of portions constituting it may be electrically connected by a connection structure including a through electrode.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

While this disclosure has been described in connection with what is presently considered to be practical implementations, it is to be understood that the invention is not limited to the disclosed implementations. On the contrary, it is intended to cover various modifications and equivalent arrangements included within the spirit and scope of the appended claims

DESCRIPTION OF SYMBOLS

SUB: second substrate
110: second horizontal conductive layer
112: first horizontal conductive layer
114: third horizontal conductive layer
200: circuit region
102: cell array region
104: contact region
120: gate stacking structure
CH: channel structure
130: gate electrode
132*m*: interlayer insulating layer
300: dummy pattern

What is claimed is:

1. A semiconductor device comprising:
a substrate including a cell array region and a contact region and having a first horizontal conductive layer,
a gate stacking structure including a plurality of interlayer insulating layers and a plurality of gate electrodes that are alternately stacked on the substrate,
a channel structure extending in a first direction crossing the substrate and extending through the gate stacking structure in the cell array region, the channel structure having a channel layer connected to the substrate and a ferroelectric layer surrounding the channel layer, and
a dummy pattern positioned on the first horizontal conductive layer and disposed between the substrate and the ferroelectric layer.

2. The semiconductor device of claim 1, wherein:
the substrate includes
a second horizontal conductive layer positioned below the first horizontal conductive layer, and
a third horizontal conductive layer positioned on the first horizontal conductive layer, and
the dummy pattern is positioned between the third horizontal conductive layer and the ferroelectric layer.

3. The semiconductor device of claim 2, wherein:
the channel layer includes a first portion overlapping the dummy pattern in the first direction, and a second portion overlapping the first horizontal conductive layer in the first direction, and
a width of the first portion is greater than or equal to a width of the second portion.

4. The semiconductor device of claim 3, wherein:
the channel layer further includes a third portion positioned under the second portion and overlapping the second horizontal conductive layer in the first direction, and
the width of the first portion is greater than or equal to a width of the third portion.

5. The semiconductor device of claim 2, wherein:
a side surface of the channel layer extends straightly 1 within the substrate.

6. The semiconductor device of claim 2, wherein:
the channel structure contacts the first horizontal conductive layer and is spaced apart from the third horizontal conductive layer.

7. The semiconductor device of claim 2, wherein:
the first horizontal conductive layer includes a protruding portion that covers a part of a side surface of the third horizontal conductive layer.

8. The semiconductor device of claim 1, wherein:
the dummy pattern contacts the ferroelectric layer.

9. The semiconductor device of claim 1, wherein:
the dummy pattern includes at least one of silicon oxide, silicon nitride, silicon oxynitride, silicon carbon oxide, silicon carbonate nitride, silicon carbide nitride, or aluminum oxide.

10. The semiconductor device of claim 1, wherein:
the ferroelectric layer includes $HfO_2$, HfZnO, HfSiO, HfSiON, HfTaO, HfTiO, HfZrO or combination thereof.

11. The semiconductor device of claim 10, wherein:
a thickness of the ferroelectric layer in a second direction orthogonal to the first direction is thicker than a thickness of the channel layer in the second direction.

12. The semiconductor device of claim 1, wherein:
the channel structure further includes a charge storing layer that is positioned between the ferroelectric layer and the gate stacking structure and that is positioned between the ferroelectric layer and the dummy pattern.

13. An electron system comprising:
a main substrate;
a semiconductor device on the main substrate; and
a controller electrically connected to the semiconductor device on the main substrate,
wherein the semiconductor device includes:
a peripheral circuit region,
a cell region including an input/output connection wire electrically connected to the peripheral circuit region, and
an input/output pad electrically connected to the input/output connection wire extending in the cell region,
wherein the cell region includes:
a substrate including a first horizontal conductive layer,
a gate stacking structure including a plurality of interlayer insulating layers and a plurality of gate electrodes alternately stacked on the substrate,
a channel structure extending through the gate stacking structure in a first direction that intersects the substrate in the cell region, and including a channel layer connected to the substrate, and a ferroelectric layer surrounding the channel layer, and
a dummy pattern positioned on the first horizontal conductive layer and disposed between the substrate and the ferroelectric layer.

14. The electron system of claim 13, wherein:
the substrate includes
a second horizontal conductive layer positioned below the first horizontal conductive layer, and
a third horizontal conductive layer positioned on the first horizontal conductive layer, and
the dummy pattern is positioned between the third horizontal conductive layer and the ferroelectric layer.

15. The electron system of claim 14, wherein:
the channel layer includes a first portion overlapping the dummy pattern in the first direction, and a second portion overlapping the first horizontal conductive layer in the first direction, and
a width of the first portion is greater than or equal to a width of the second portion.

16. The electron system of claim 13, wherein:
the ferroelectric layer includes $HfO_2$, HfZnO, HfSiO, HfSiON, HfTaO, HfTiO, HfZrO or combination thereof.

17. The electron system of claim 13, wherein:
the dummy pattern includes at least one of silicon oxide, silicon nitride, silicon oxynitride, silicon carbon oxide, silicon carbonate nitride, silicon carbide nitride, and aluminum oxide.

18. A manufacturing method of a semiconductor device comprising:
stacking a horizontal insulation layer on a second horizontal conductive layer and a third horizontal conductive layer on the horizontal insulation layer,
forming a dummy hole by patterning the third horizontal conductive layer so that an upper surface of the horizontal insulation layer is exposed,
forming a dummy pattern within the dummy hole,
forming a stacking structure by sequentially repeating an interlayer insulating layer and a sacrificial insulation layer on the third horizontal conductive layer and the dummy pattern,
forming a channel structure extending through the stacking structure, the dummy pattern, and the horizontal insulation layer,
removing the horizontal insulation layer to create a first removed space,
forming a first horizontal conductive layer within the first removed space,
removing the sacrificial insulation layer to create a second removed space, and
forming a gate electrode within the second removed space.

19. The manufacturing method of the semiconductor device of claim 18, wherein:
the horizontal insulation layer includes a first horizontal insulation layer, a second horizontal insulation layer, and a third horizontal insulation layer sequentially positioned on the second horizontal conductive layer,
the removing of the horizontal insulation layer includes:
removing the second horizontal insulation layer so that a bottom surface of the first horizontal insulation layer and an upper surface of the third horizontal insulation layer are exposed and
removing the first horizontal insulation layer and the third horizontal insulation layer.

20. The manufacturing method of the semiconductor device of claim 18, wherein:
the channel structure includes
a channel layer,
a semiconductor insulating pattern surrounding the channel layer, and
a ferroelectric layer positioned between the semiconductor insulating pattern and the stacking structure, and
the removing of the horizontal insulation layer includes
removing a part of the ferroelectric layer and the semiconductor insulating pattern so as to expose the channel layer of the channel structure.

* * * * *